United States Patent [19]

Deveau

[11] Patent Number: 5,157,348
[45] Date of Patent: Oct. 20, 1992

[54] SMART PROGRAMMABLE GAIN AMPLIFIER

[75] Inventor: David M. Deveau, Portsmouth, R.I.

[73] Assignee: The United States of America as represented by the Secretary of the Navy, Washington, D.C.

[21] Appl. No.: 776,914

[22] Filed: Oct. 15, 1991

[51] Int. Cl.$^5$ .............................................. H03G 3/30
[52] U.S. Cl. .................................... 330/279; 330/295; 330/124 R; 328/104; 328/154; 307/243
[58] Field of Search .................... 330/279, 295, 124 R, 330/51, 129; 328/104, 154; 307/243

[56] References Cited

U.S. PATENT DOCUMENTS

| | | | |
|---|---|---|---|
| 4,194,163 | 3/1980 | Gillespie | 330/279 |
| 4,308,598 | 12/1981 | Mahmood | 307/243 |
| 4,535,299 | 8/1985 | Streckmann et al. | 330/279 |
| 4,535,300 | 8/1985 | Streckmann | 330/279 |
| 4,553,104 | 11/1985 | Olsen | 330/279 |
| 4,939,729 | 7/1990 | Weisser | 207/243 |

Primary Examiner—Eugene R. LaRoche
Assistant Examiner—Tan Dinh
Attorney, Agent, or Firm—Michael J. McGowan; Prithvi C. Lall; Michael F. Oglo

[57] ABSTRACT

The Smart Programmable Amplifier System provides a microprocessor based amplification system which uses programmable gain amplifier (PGA) techniques. It is used in remote data acquisition systems where it must cover a wide signal range, but the actual measurement range is much smaller during a given time interval. The system interfaces to a host computer to provide complete operator control and to relay continuous status information. The system provides automatic and programmable gain control to meet individual test requirements.

6 Claims, 40 Drawing Sheets

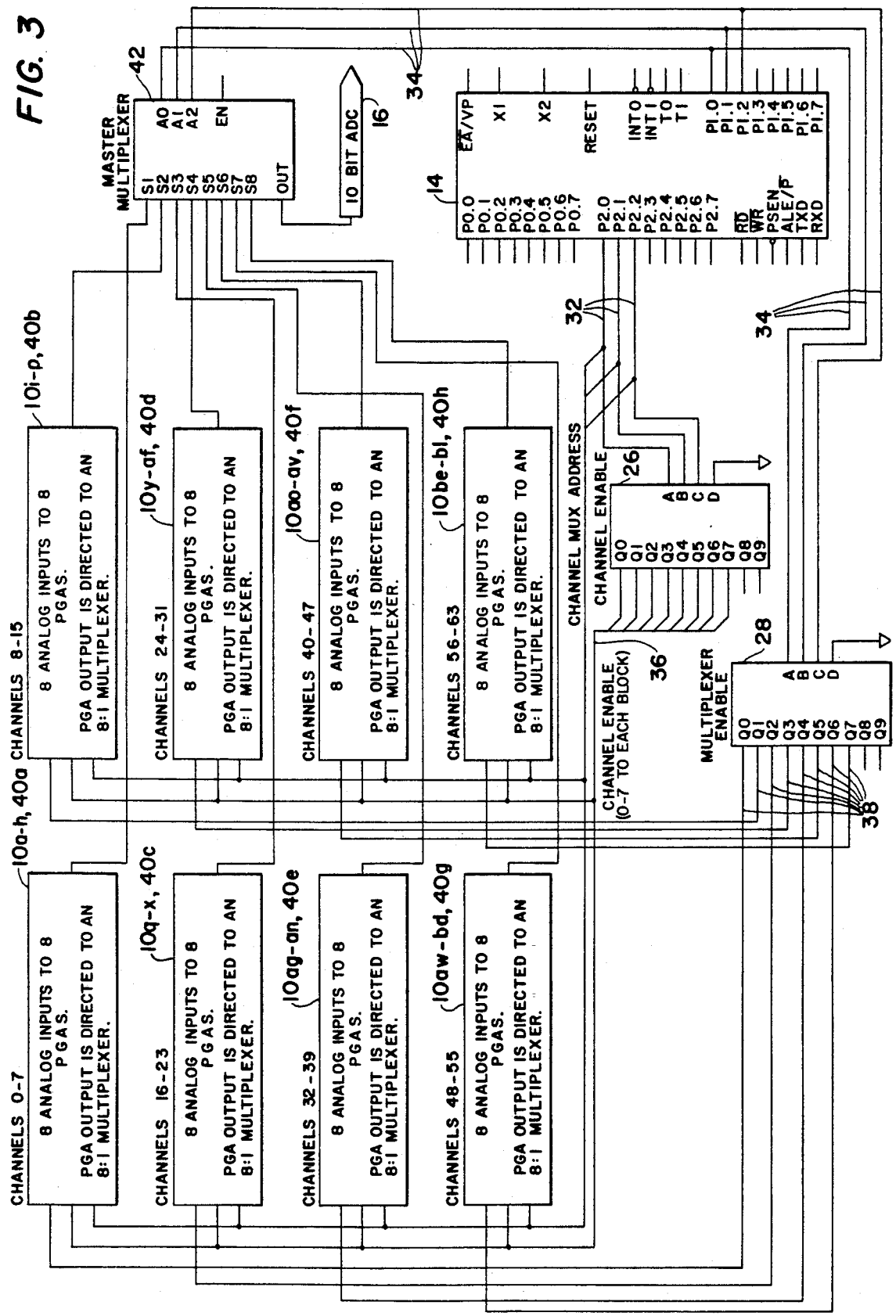

8) XMIT_COM = Holds information to be transmitted to the Host computer (HOST).

9) CHAN_LOC = Holds the multiplexer channel address of an amplifier whose gain is locked.

10) CHAN_UNLOC = Holds the multiplexer channel address of an amplifier whose gain will be unlocked and the amplifier will be allowed to AGC.

11) CLR_FLG = Informs the "ALL CLEAR" subroutine to unlock all gains (CLR_FLG=1) or only a specific amplifier (CLR_FLG=0).

12) AMP_LOC[ ] = Holds the address of all channels whose gains are locked and not allowed to AGC. This is and array which is indexed by the variables which select the channel and multiplexer addresses.

13) STATUS_TMP = Temporary storage register for the status register. Used when a routine changes the register but the original register states must be preserved and restored, before returning to the main program.

14) CHAN_LOC_TMP = Temporary storage register for the value held in CHAN_LOC.

Microprocessor I/O:

PORT 2; Pins 0 - 2: Are used to sequence the channel multiplexer and to enable the gain latches associated with that multiplexer. Abbreviated P2(0) for PORT 2, Pin 0.

PORT 2; Pins 3 - 5: Are used to set the amplifier's gain. The gain setting is latched through the selection meade in the channel address decoder.

PORT 1; Pins 0 - 2: Are used to enable the gain latches and to address the master multiplexer.

```
                    SOLO_LOC  SUBROUTINE
```

This routine uses the variable CHAN_LOC to determine which amplifier channel will have its gain locked at its current level.

Clear the B4 flag in the STATUS register.

STATUS  <AND>  11101111B  -->  STATUS

CHAN_LOC will contain the address to select the appropriate channel and the appropriate path through the master multiplexer.

CHAN_LOC:

0  0  X  X  X   X  X  X
        └──┬──┘   └──┬──┘
         Master    Channel
         MUX       address
         address Get the address of the channel whose gain is to be locked ie, no more AGC.

Move  CHAN_LOC  -->  AX

AX now contains a value between 0 and 63 decimal. This value will be used to address a location which will prevent the "Gain Latch Enable", for this channel, from being selected for AGC.

SYS_AGC SUBROUTINE

This routine will automatically adjust the gain for each analog amplifier to provide the best ADC resolution for all signals. The Dynamic Range, of the Data Acquisition ADC is programmed into the uP. For this program the following conditions exist: — 48 a) Data Acquisition ADC = 10 bits
b) Reference voltage for ADC = 10V
c) Data Acquisition resolution = 9.77mV This resolution yields a dynamic range equal to 60 dB without and amplifier gain.

The program will determine the maximum signal strength per amplifier and determine what gain level could be used to bring the amplified signal within 3dB of 10 Volts. This will provide space for signal fluctuations.

---

This routine will assume the maximum number of channels per multiplexer (8) and the maximum number of multiplexers (8).

The variables MUX_CHAN and MUX_INDEX will be used as counters to address the channels and multiplexers.

---

The routine begins with multiplexer number 8 (MUX_INDEX=7) and amplifier channel number 8 (MUX_CHAN=7).

---

MUX_CHAN is the counter variable for sequencing through all the amplifier channels. It serves as the channel address when accessing memory.

MUX_INDEX is the counter variable for

```
┌─────────────────────────────────────┐
│ sequencing through the Master Multiplexer. │──── 52
│ It serves as the multiplexer address when  │  (CONTINUED
│ accessing memory.                          │  FROM FIG.14a)
└─────────────────────────────────────┘
                  │
                  ▼
┌─────────────────────────────────────┐
│ Put the maximum number of channels (0-7)  │
│ into MUX_CHAN and the maximum number of   │
│ multiplexers (0-7) into MUX_INDEX.        │
│                                           │
│       Move   AMP_ADD  --> MUX_CHAN        │
│       Move   MUX_MST  --> MUX_INDEX       │
└─────────────────────────────────────┘
                  │
                  ▼
┌─────────────────────────────────────┐
│ Select the proper channel by setting the  │──── 50
│ uP's I/O pins.                            │
│                                           │
│       Move   MUX_CHAN  --> P2(0-2)        │
│       Move   MUX_INDEX --> P1(0-2)        │
└─────────────────────────────────────┘
                  │
                  ▼
┌─────────────────────────────────────┐
│ Determine if the selected amplifier       │
│ channel has its channel gain locked or not.│
└─────────────────────────────────────┘
                  │
                  ▼
┌─────────────────────────────────────┐
│ Set-up a memory pointer to look at the    │
│ proper location within the array that holds│
│ the flags for all locked amplifiers,      │
│ AMP_LOC.  MEM_ADD holds the address pointer│
│ for the array locations, in this routine. │
└─────────────────────────────────────┘
                  │
                  ▼
┌─────────────────────────────────────┐
│       Move  MUX_INDEX --> AX(3-5)         │
│                                           │
│   MUX_CHAN  <OR>  AX  -->  MEM_ADD        │
└─────────────────────────────────────┘
                  │
                  ▼
┌─────────────────────────────────────┐
│ MEM_ADD now contains the proper           │
│ channel/mux memory address.  Its format   │
│ is as follows.                            │
│                                           │
│          X  X  B  B  B   B  B  B          │
│                └─────┘   └─────┘          │
│                MUX_INDEX  MUX_CHAN        │
└─────────────────────────────────────┘
                  │
                  ▼
                [S20]
```

SMART PROGRAMMABLE GAIN AMPLIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1.) Field of the Invention

The present invention generally relates to data acquisition circuits. More particularly the invention provides remote signal processing in the area of the sensors of underwater vehicle noise. Still more particularly, the invention relates to a programmable gain amplifier of special utility in connection with the foregoing fields of application.

(2) Description of the Prior Art

In many data acquisition systems, the amplifiers and recording equipment must be designed to capture the entire analog dynamic range of any possible device it may be called on to measure. Prior to a data acquisition system's design, future technical projections have to be made to determine what dynamic ranges may eventually exist while still being able to measure present dynamic ranges. Current remote systems are designed in a static format, with components selected to cover any possible signal range. Components, such as signal amplifiers, are selected on their ability to cover wide dynamic ranges (greater than 60 dB) but this choice generally leads to tradeoffs such as cost and component availability.

Amplification techniques are employed to translate the measured signal into a range that can be recorded and analyzed. A standard amplification technique used is to employ an automatic gain control (AGC) amplification unit which continually adjusts its gain such that the signal is kept within a specific dynamic range. Alternatively, an operator may also specify an amplification level through a front panel or computer interface.

The limitation to present AGC amplification techniques are mainly caused by the AGCs location and physical size. A typical AGC system would be contained within a 19"×19" drawer and consume tens of watts of power. This AGC unit would also reside far away from the point where the analog signals are being gathered because its size prevents it from being placed with the sensors. The signal's wide dynamic range is maintained from the system's sensor/receiver unit through to the analysis system's front end. The wide dynamic range is then compressed by an AGC into a smaller dynamic range consistent with the actual dynamic range of the item generating the analog signals.

Although not available in the prior art, in the present invention the AGC unit is moved to be the first amplifier after the sensor/receiver unit, the received signal then immediately maps into a dynamic range compatible to all system components and thereby reduces the stringent dynamic range requirements imposed by maintaining an all encompassing dynamic range.

A multi-channel AGC unit of more than fourteen channels is too large to be contained within a remote noise measurement system such as an underwater measurement array. Measurement arrays require low power amplifiers which must operate in pressure vessels that are small enough to be handled by one or two people. Current AGC units are neither small nor low power and are not designed to exist in hazardous environments.

SUMMARY OF THE INVENTION

Accordingly, it is a general purpose and object of the present invention to provide an improved data acquisition system. It is a further object to provide automatic gain control techniques on the acquired data at locations near the sensors. Another object is that the components in each channel that process the acquired data from the sensors are small enough to be located near the sensors. These and additional objects are accomplished with the present invention by providing a system having a microprocessor based automatic/programmable gain control amplifiers suitable for location in remote data gathering units. The system's central device is an Intel 8051 microprocessor which controls all the amplification devices and provide communications to the operator's host computer system. Once enabled, the microprocessor ($\mu$P) operates in a loop where it continually monitors up to 64 amplifiers and adjusts their gains so they are at an optimum level for the components used to carry, record and analyze the signals. Although the system is designed to perform AGC operations, it AGCs only until the received signal is properly mapped into the data acquisition system's dynamic range. Once this is accomplished, the gain is locked to prevent further gain adjustments. In the case of underwater vehicle noise measurement, the system AGCs until the vehicle is some distance "R" from the measurement device. At distance "R", the gain is locked and decreased by an amount as close as possible to (20 LOG(R)) to account for transmission loss. In doing so, the signal has the same intensity when it is close to the measurement device as it is at a distance "R" prior to the gain decrease. By allowing the amplifier to AGC, it sets its own maximum signal level based on existing conditions and removes operator guess work concerning signal conditions. This system is not meant to provide AGC throughout an entire measurement period. This would require $\mu$P-to-host computer updates every time a channel's gain was changed, which would make data analysis almost impossible.

BRIEF DESCRIPTION OF THE DRAWINGS

FIG. 3 shows a block diagram of a complete 64 channel Smart PGA System in accordance with the present invention;

FIGS. 4a–f is the Main Program flow chart of the operation of the Smart PGA System of FIGS. 1, 2 and 3;

FIG. 9a-b is a SOLO LOC Subroutine Program flow chart of the operation of the Smart PGA System of FIGS. 1, 2 and 3;

FIG. 14a-h is a System Automatic Gain Control Subroutine Program flow chart of the operation of the Smart PGA System of FIGS. 1, 2 and 3;

DESCRIPTION OF THE PREFERRED EMBODIMENT

Figure 1:
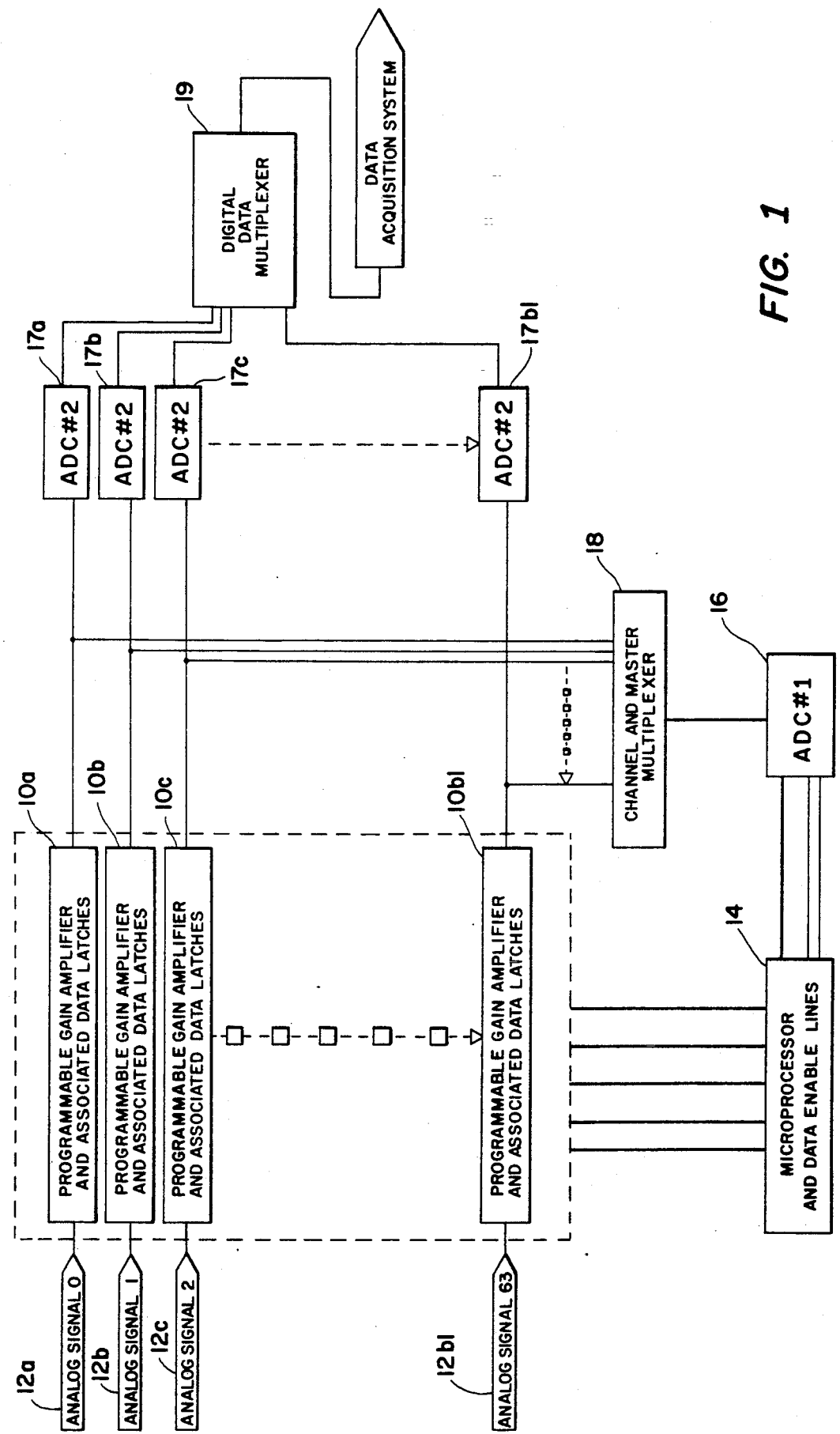
FIG. 1 is a block diagram of a data acquisition system that includes the Smart Programmable Gain Amplifier (PGA) System of the present invention.

Refer now to FIG. 1 which depicts the utilization of the Smart PGA in data acquisition systems. Channels 0-63 $10a-b1$ process received analog data signals $12a-b1$ under the direction of a microprocessor and data enable lines, generally designated control system 14. The microprocessor and data lines will be described in greater detail hereinafter. The processed analog data signals from channels $10a-b1$ are directed to analog to digital converters (ADCs) 16 and $17a-b1$. ADC#1 16 receives the outputs of all channels $10a-b1$. ADCs#2 $17a-b1$ each receive an output of a respective channel $10a-b1$. A channel and master multiplexer 18 provides an interface between channels $10a-b1$ and ADC#1 16. The channel and master multiplexer 18 selects which channel $10a-b1$ is to provide a signal to ADC#1 16. Both the channel and master multiplexer 18 and ADC#1 16 are controlled by the control system 14. ADC#1 16 provides the control system 14 with a digital representation of the outputs of the selected channels $10a-b1$. ADCs#2 $17a-b1$ are part of a Digital Data Acquisition (DDA) system. Their job is to sample all channels $10a-b1$ at a frequency which allows for proper signal reconstruction and to supply their outputs to a digital data multiplexer 19.

The DDA system including ADCs#2 $17a-b1$ and digital data multiplexer 19 are not part of the Smart PGA system but are one application of it. The DDA has the following signal requirements: (a) ADCs#2 $17a-b1$ are each 10 bits wide, (b) total dynamic range =96 dB, (c) dynamic range for a given measurement =60 dB, maximum signal level =10 volts, and minimum signal level =158 microvolts.

The control system 14 can monitor up to all 64 channels $10ab1$ of analog data. The analog data signals are received and properly matched by acoustic hydrophones or microphones (not shown). Each acoustic hydrophone or microphone then supplies its signals $12a-b1$ to a respective channel $10a-b1$.

Figure 2:
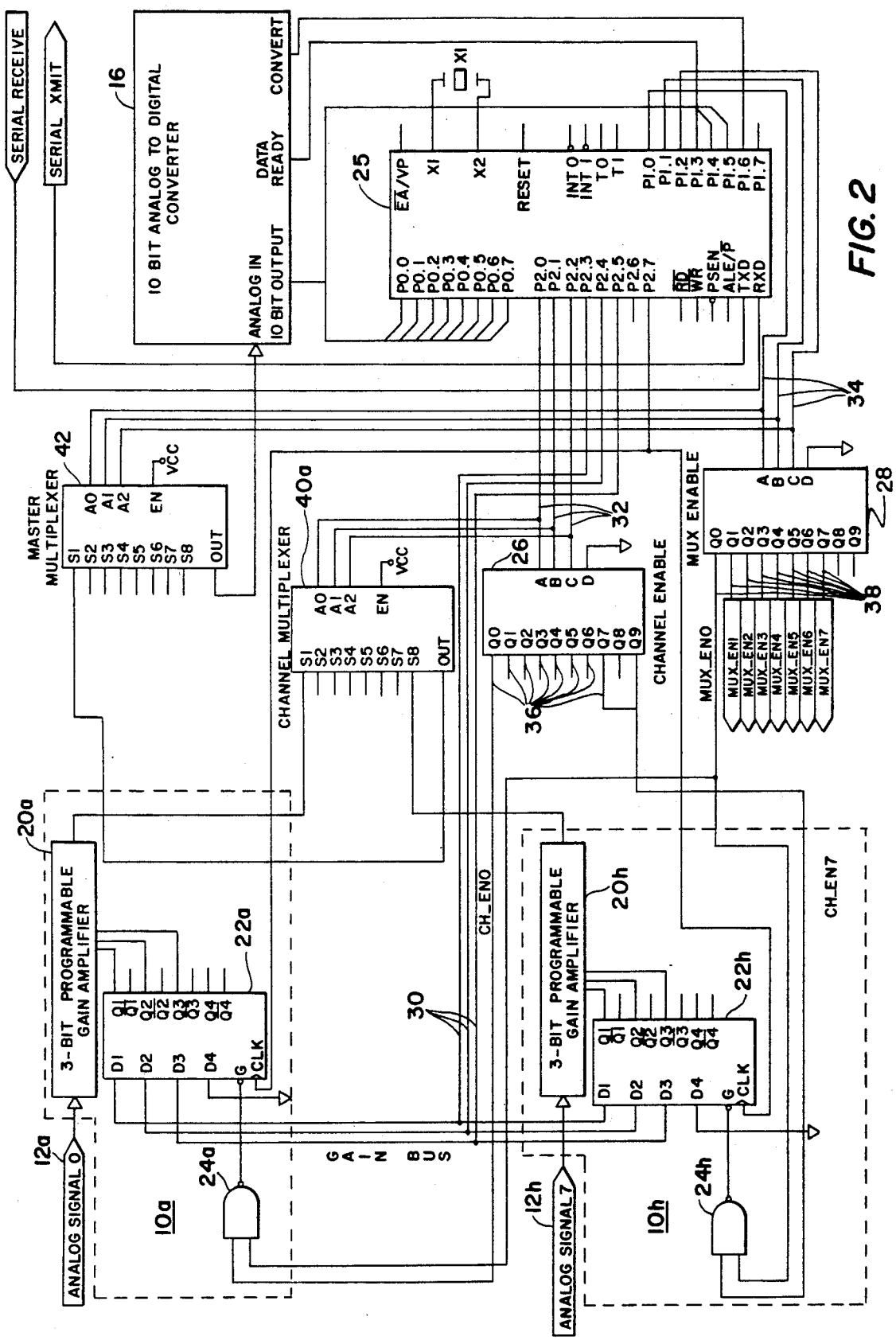
FIG. 2 shows a schematic-block diagram of a portion of the Smart PGA System of FIG. 1.
Figure 4A:
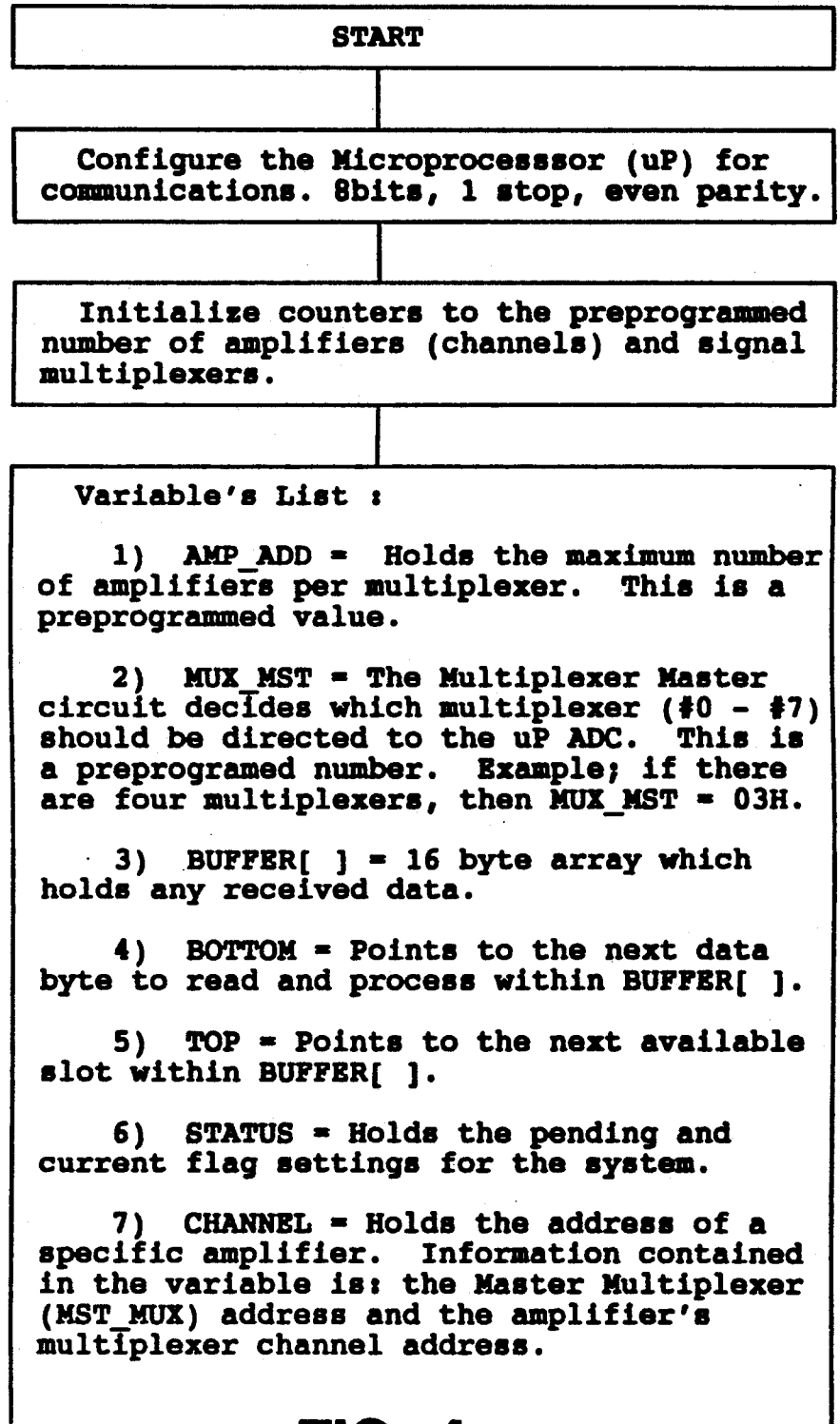
Figure 4C:
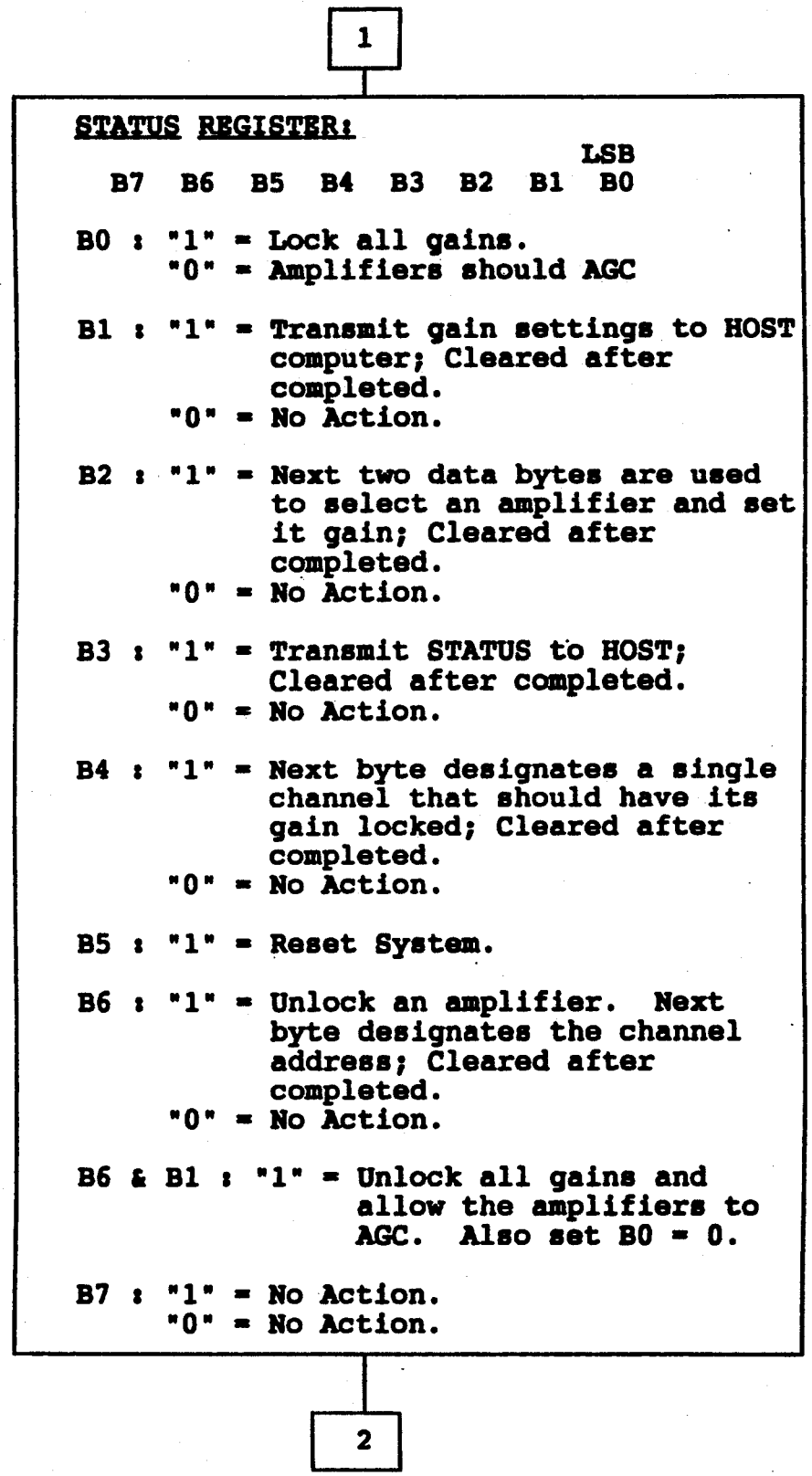
Figure 4D:
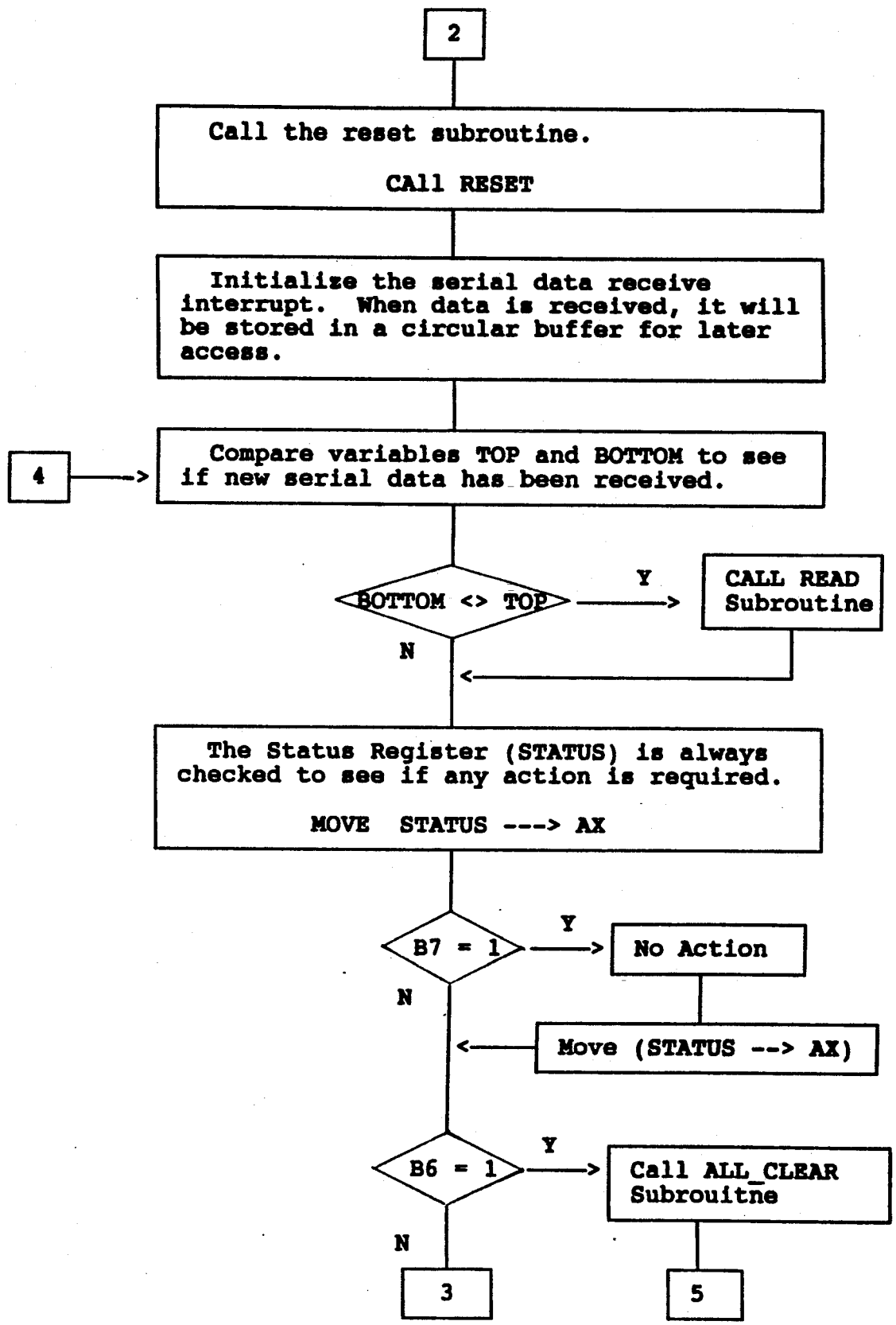
Figure 4E:
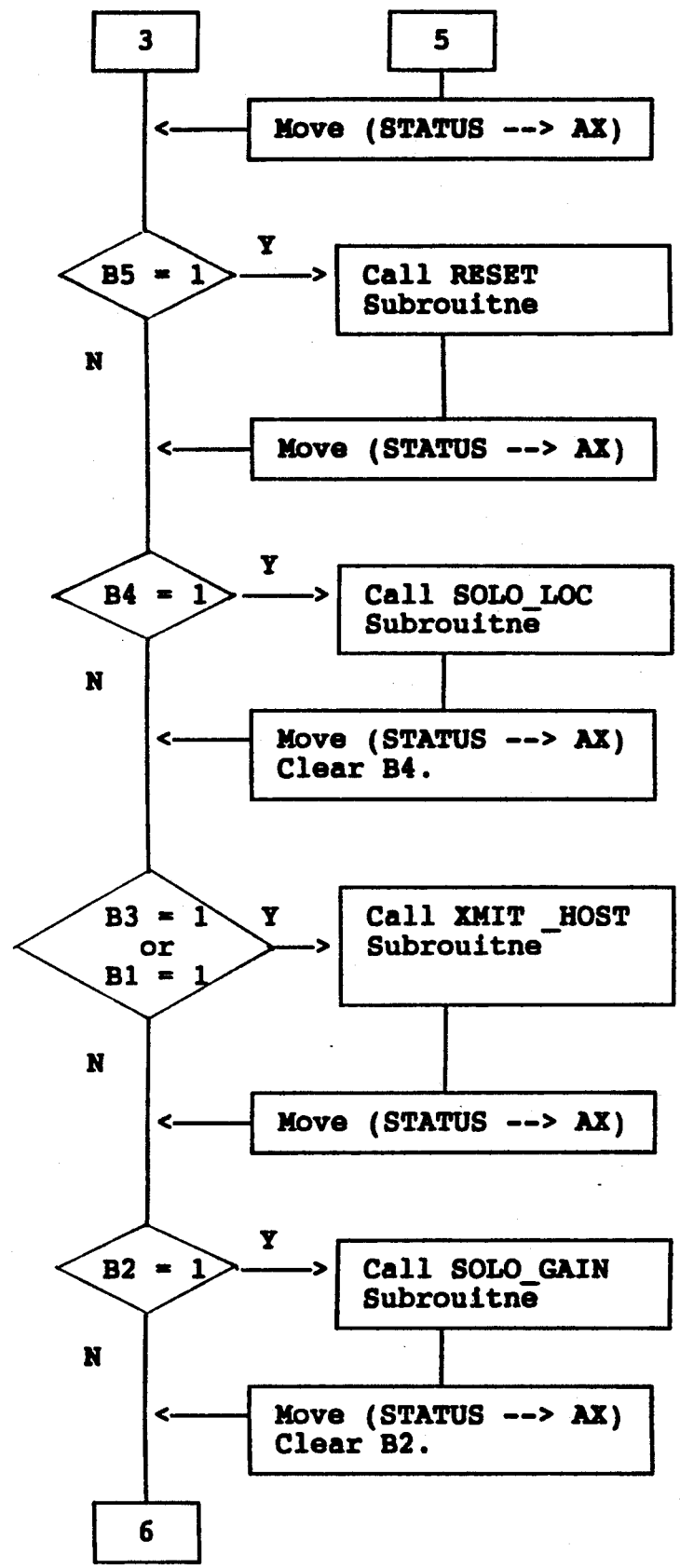
Figure 4F:
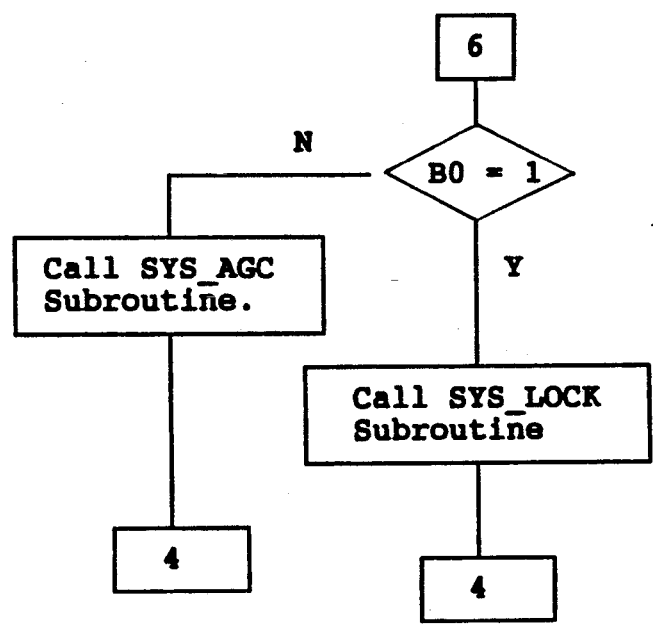

Refer now to FIG. 2 for a more detailed explanation of channels 0-7 $10a-h$ and the components associated with their operation. FIG. 2 shows that each of the channels 0-7 $10a-h$ have programmable gain amplifiers (PGA's) $20a-h$ for receiving respective analog data signals $12a-h$. The channels 0-7 $10a-h$ also have respective data latches (HC379) $22a-h$ and AND gates (4011) $24a-h$ associated with the pGA's $20a-h$. It is to be understood that the remaining channels 8-63 $10i-bl$, not shown in FIG. 2 have the same individual components associated with them.

The PGAs $20a-h$ are Burr-Brown 3606 or equivalent and they are the first amplifiers that the received signal sees. Each data latch $22a-h$ maintains the chosen gain setting for its associated PGA $20a-h$ and the AND gates $24a-h$ provide their respective data latches $22a-h$ with an enable signal such that each data latch $22a-h$ selected can accept new gain settings to adjust its respective PGA $20a-h$.

The control system 14 is comprised of microprocessor ($\mu P$) 25, channel enable 26 and multiplexer enable 28. The data latch enable signal is created from two other enable signals, the channel enable signal (CH_EN) from channel enable 26 and the multiplexer enable signal (MUX_EN) from multiplexer enable 28. second channel, within each block of eight channels $10a-h$, $10i-p$, $10q-x$, $10y-af$, $10ag-an$, $10ao-av$, $10aw-bd$, and $10be-bl$, FIG. 3. The MUX_EN then is set to decide which block of the eight channels listed above will be active. The two selections result in the selection of only one channel from the possible 64 channels $10a-bl$.

The channel enable 26 and the multiplexer enable 28 are both address decoders (4028) and each has a separate three bit address created by the $\mu P$ 25 and transmitted on respective address lines 32 and 34 to set the respective one of enable lines 36 and 38. Once a channel's latch, such as latch $22a$, is selected, the $\mu P$ 25 triggers the latch $22a$ to read a new gain setting off the three bit gain bus 30. The latch $22a$ then holds the new gain setting and the PGA $20a$ adjusts its output signal according to the newly specified gain adjustment.

Refer to FIGS. 2 and 3. The same address lines 32 and 34 that set the proper enable lines 36 and 38 also direct the PGA's $20a-bl$ output through two analog multiplexers (AD7501), one of eight channel multiplexers $40a-h$ (FIG. 2 shows only the channel multiplexer $40a$) and the other the sole master multiplexer 42. The analog multiplexers $40a-h$ (AD7501) and 42 (AD7501) are similar to the two separate enable line decoders 26 and 28. The eight channel multiplexers $40a-h$ select one of the eight PGA outputs in each block, to be analyzed by the $\mu P$ 25. The master multiplexer 42 then chooses which block of eight channels $40a-h$ is directed to the $\mu P$'s analog to digital converter (ADC#1) $16a$.

In FIG. 3 the channel multiplexers $40a-h$ are included in the blocks with PGAs $20a-bl$ for ease in understanding the invention. It is to be understood that each block of channels $10a-h$ sends out 8 respective signals to each of the channel multiplexers $40a-h$. The channel multiplexers $40a-h$ then select one signal from each block of channels such as channel multiplexer $40a$ selects one signal from channels $10a-h$ to be forwarded to master multiplexer 42.

Refer now to all the figures for a description of the flow diagram of FIGS. $4a-f$ to $14a-h$. The detailed flow diagram is given to explain the operations within the $\mu P$ 25. Almost the entire system is based on the operations which take place within the $\mu P$ 25 and its interaction with the aforementioned hardware and the host computer (not shown) which is connected to operate the $\mu P$ 25.

ADC#1 16 is a 10 bit converter but since it does not have to sample the analog signals at a rate necessary for later reconstruction, there are no strict requirements on the unit's signal conversion rate. A short time out is set to allow for one of the PGAs 20a-bl output signals to propagate through the analog multiplexers, one of 40a-h and the other 42, before the μP 25 initiates a conversion pulse to start ADC#1 16. After the signal is converted to digital form, ADC#1 16 notifies the μP 25 that data is available by toggling its data ready (DR) line. The μP 25 then reads the data and performs several gain calculations to determine if the gain, for the selected channel, is properly set. If the gain is properly set then the μP 25 proceeds to the next channel and repeats the process. Otherwise it adjusts the gain accordingly and analyzes the new reading to see if the new gain is properly set.

Figure 5A:
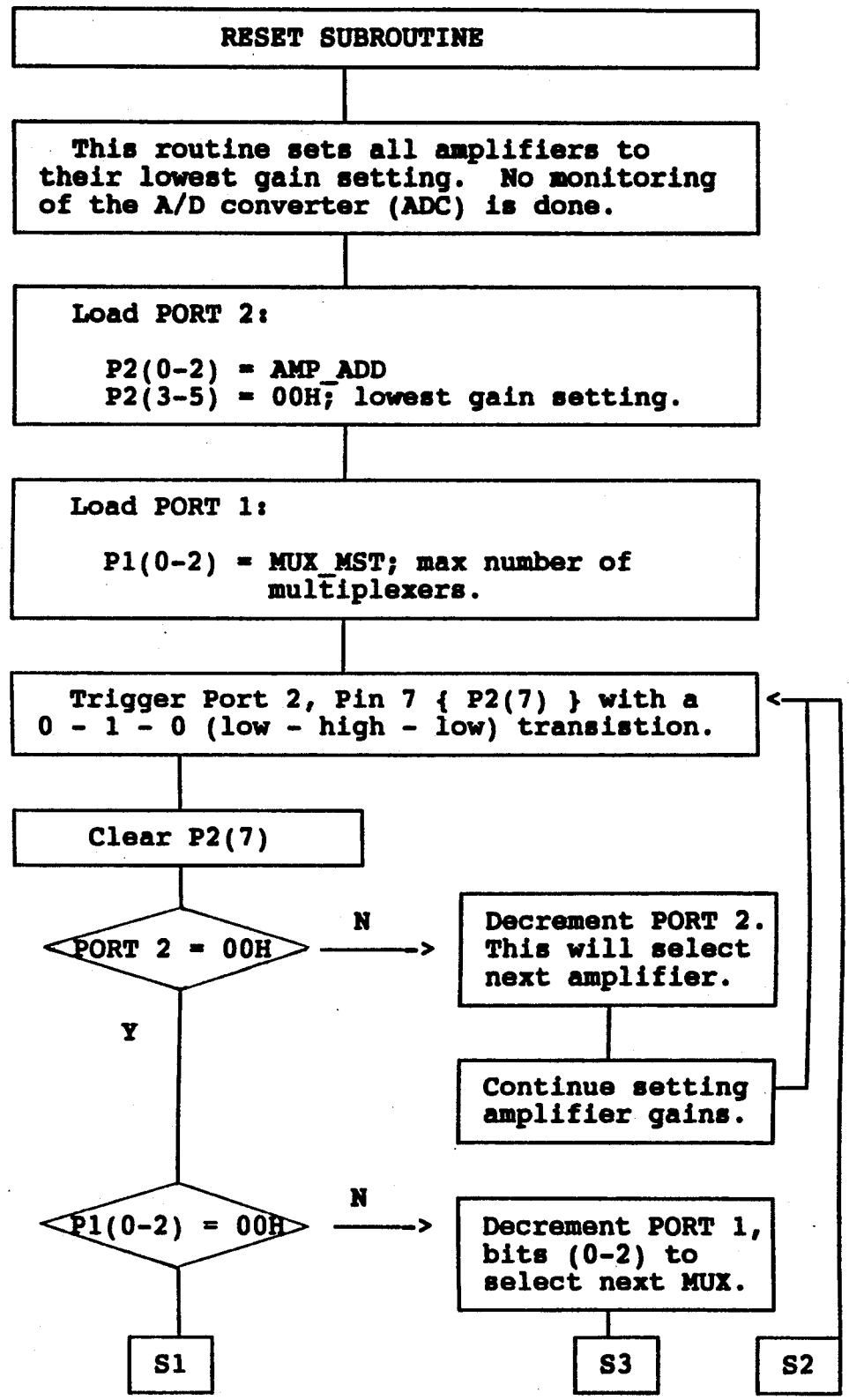
FIGS. 5a–b is a Reset Subroutine Program flow chart of the operation of the Smart PGA System of FIGS. 1, 2 and 3.
Figure 5B:
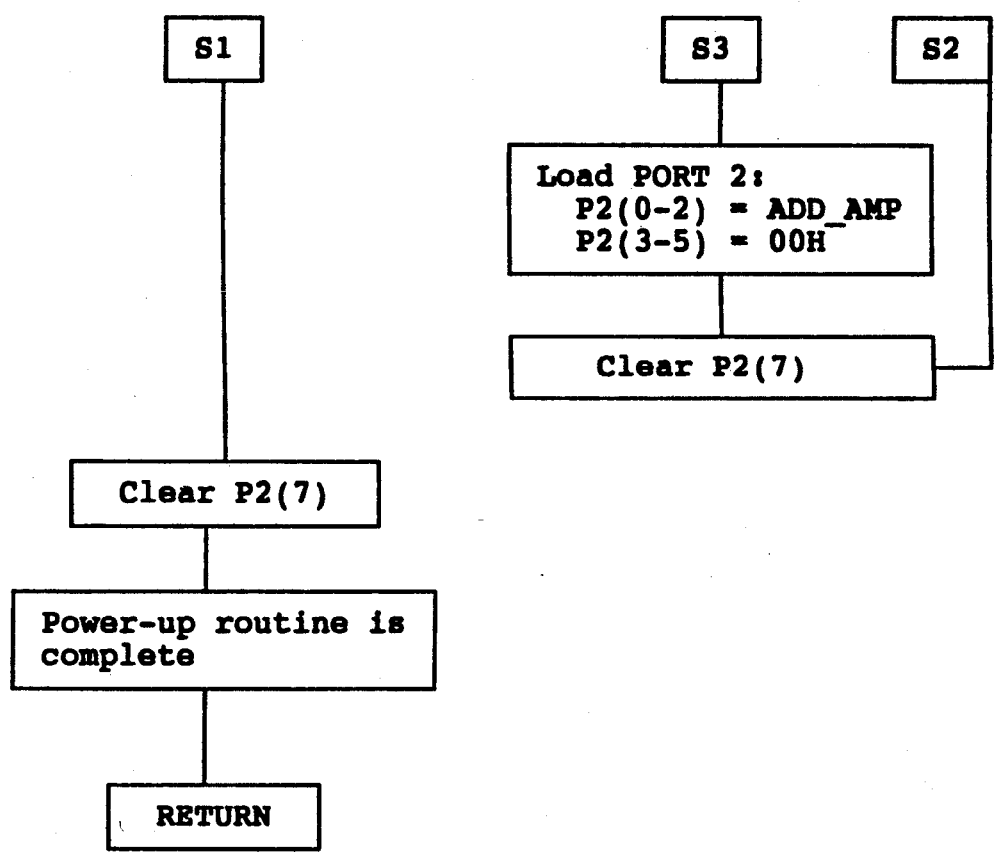

When the system is powered-up, the μP 25 initiates the Reset (RESET) Subroutine of FIGS. 5a-b. Within the RESET Subroutine, the μP 25 addresses each PGA 12a-bl and sets its gain to the lowest possible setting. The lowest setting is the gain setting assigned the binary number 000. Prior to installation, the μP 25 is programmed with the total number of channels and their distribution between channel multiplexers. This is accomplished by programming two variables with the number of channels used by each channel multiplexer 40a-h and the number of inputs supported by the master multiplexer 42. The μP 25 uses the two variables to index the program counters to the proper sequencing for addressing the channel and multiplexer enable integrated circuits 26 and 28, respectively. The significance of this is further discussed hereinafter in connection with the System Automatic Gain Control (SYS_AGC) Subroutine, FIGS. 14a-h. Once completed, the routine returns program control to the Main Program of FIGS 4a-f.

Figure 6:
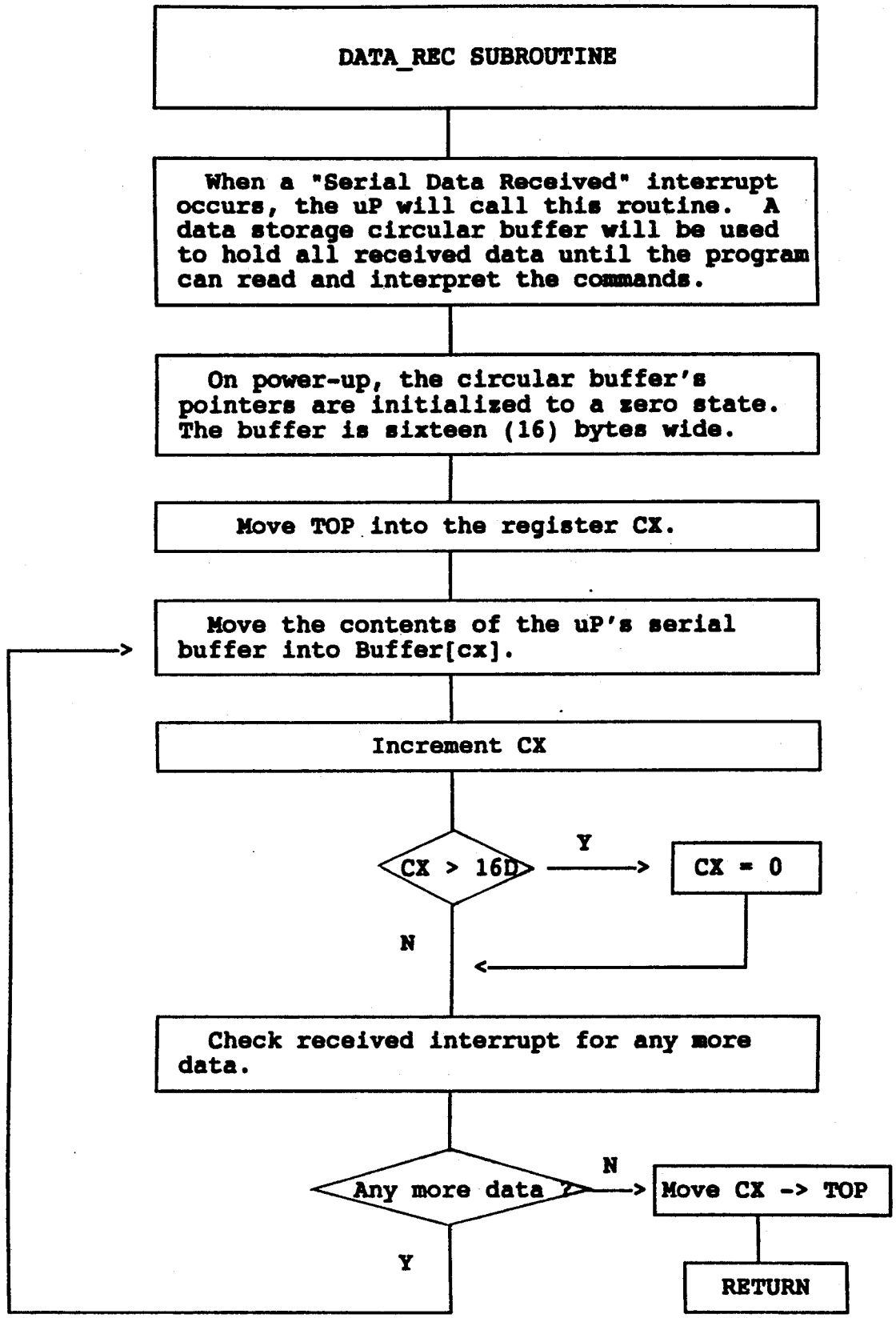
FIGS. 6 is a Data Received Subroutine Program flow chart of the operation of the Smart PGA System of FIGS. 1, 2 and 3.
Figure 7A:
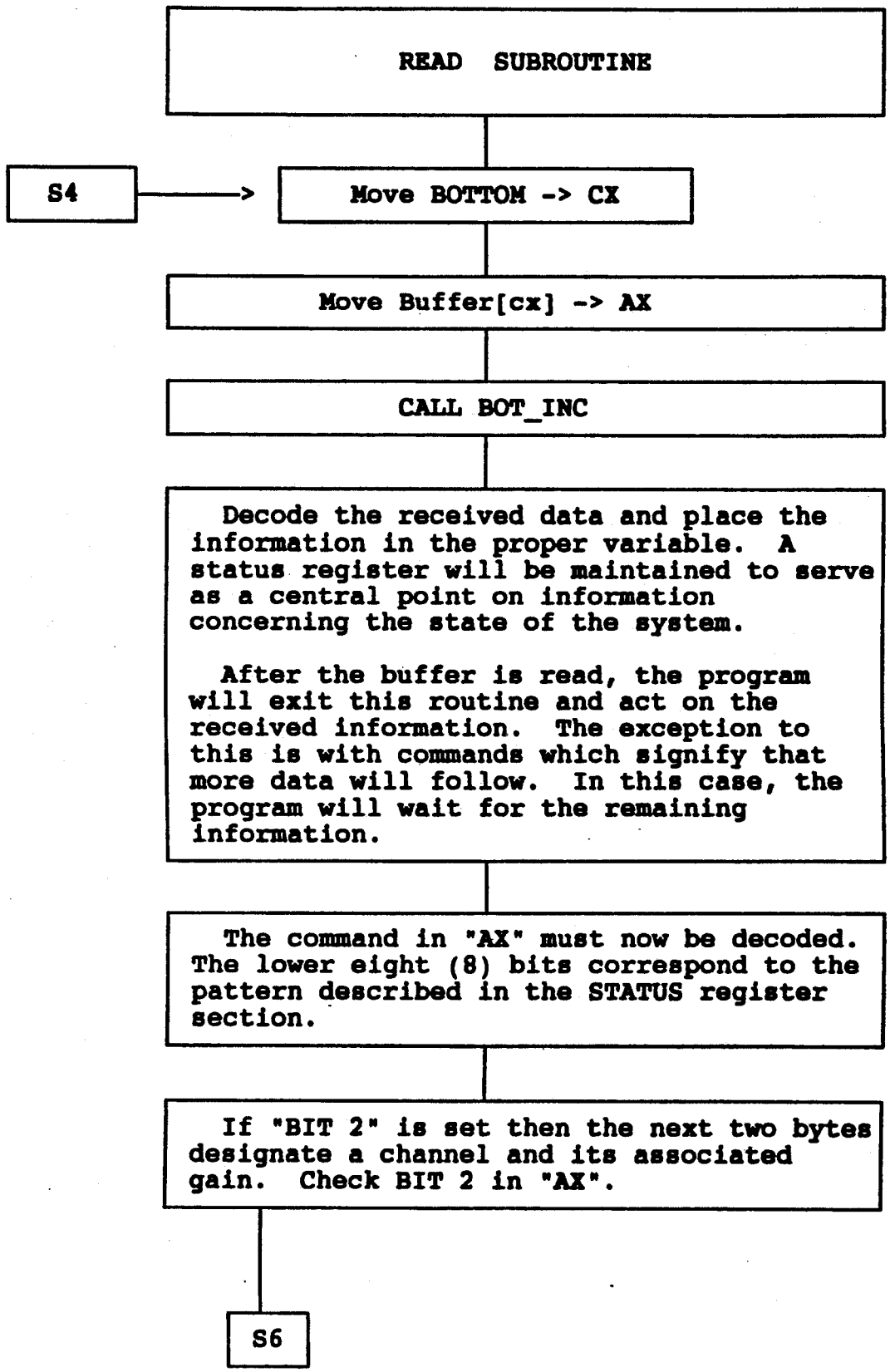
FIGS. 7a–j is a Read Subroutine Program flow chart of the operation of the Smart PGA System of FIGS. 1, 2 and 3.
Figure 7B:
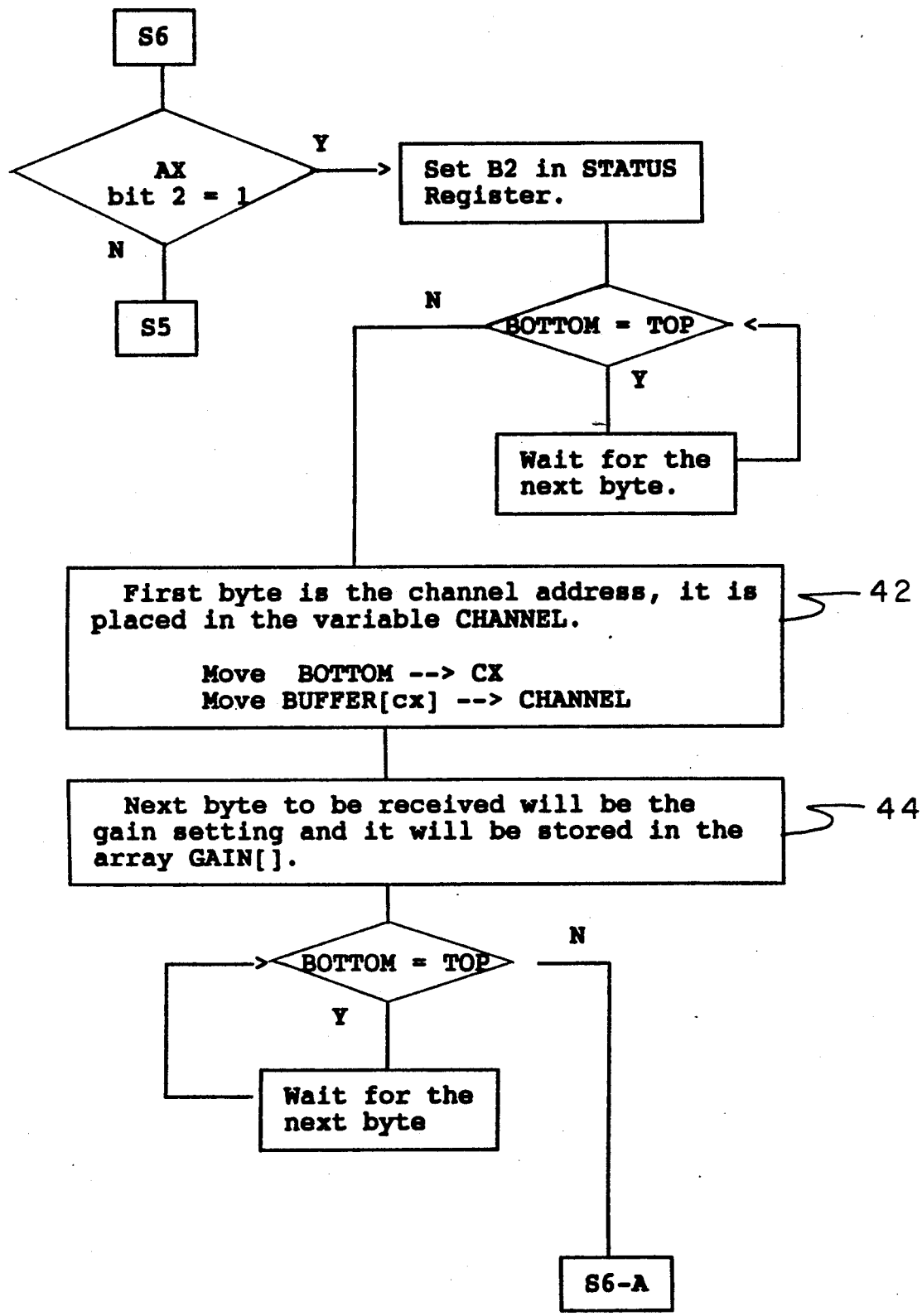
Figure 7C:
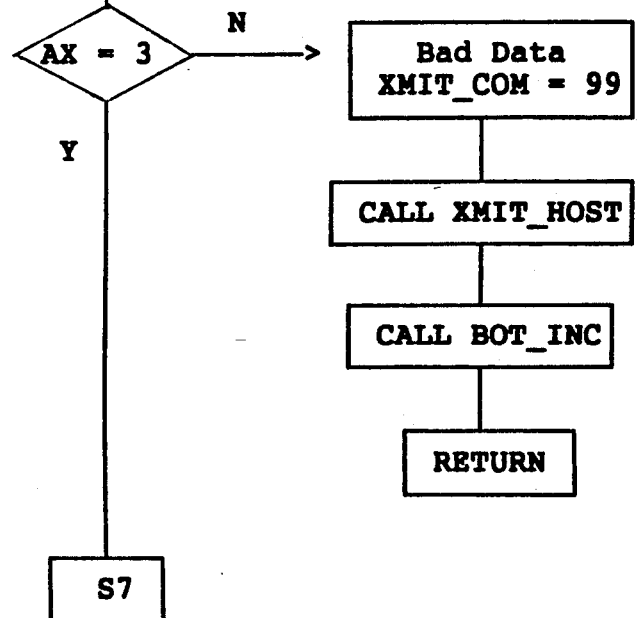
Figure 7D:
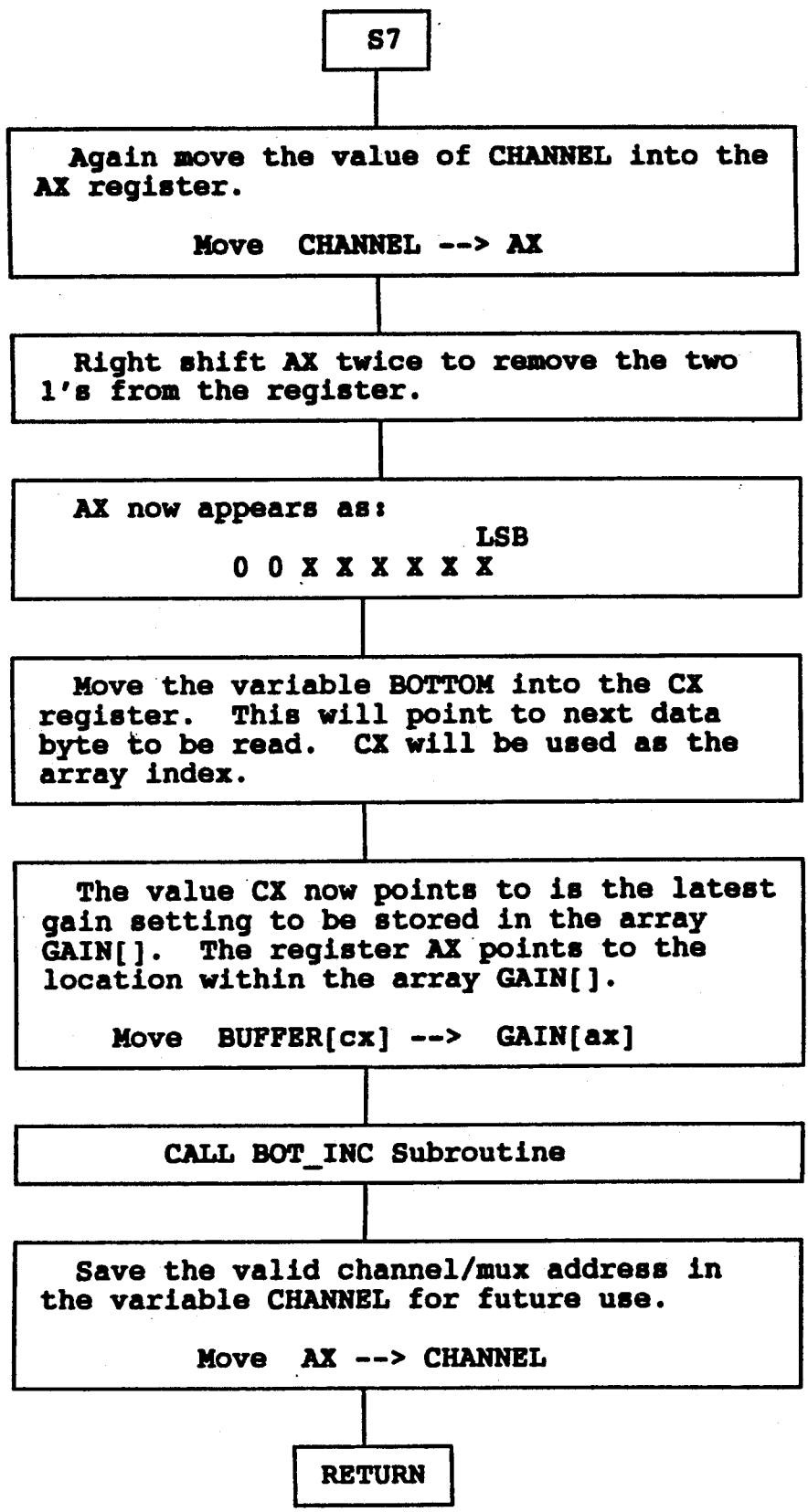
Figure 7E:
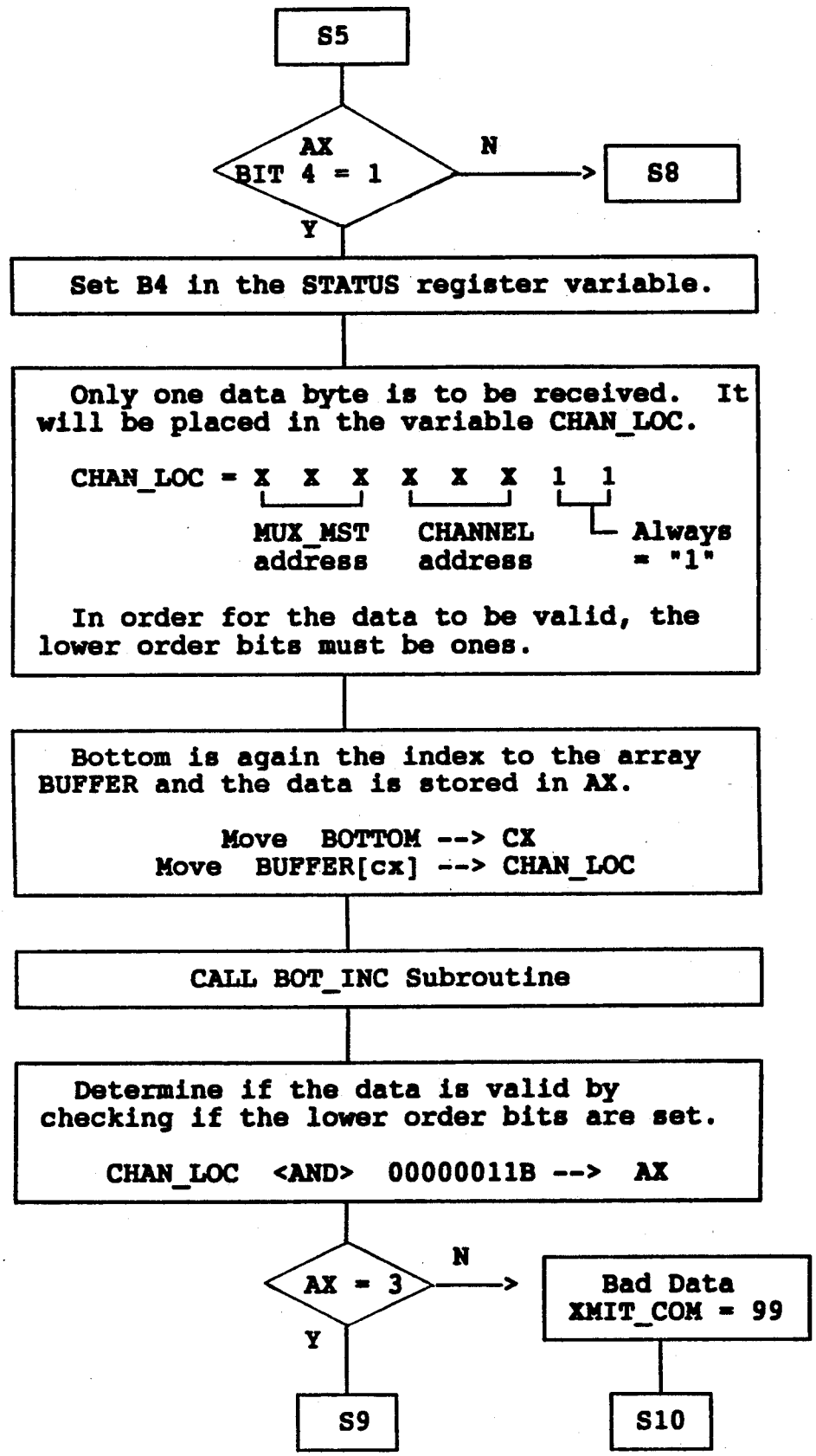
Figure 7F:
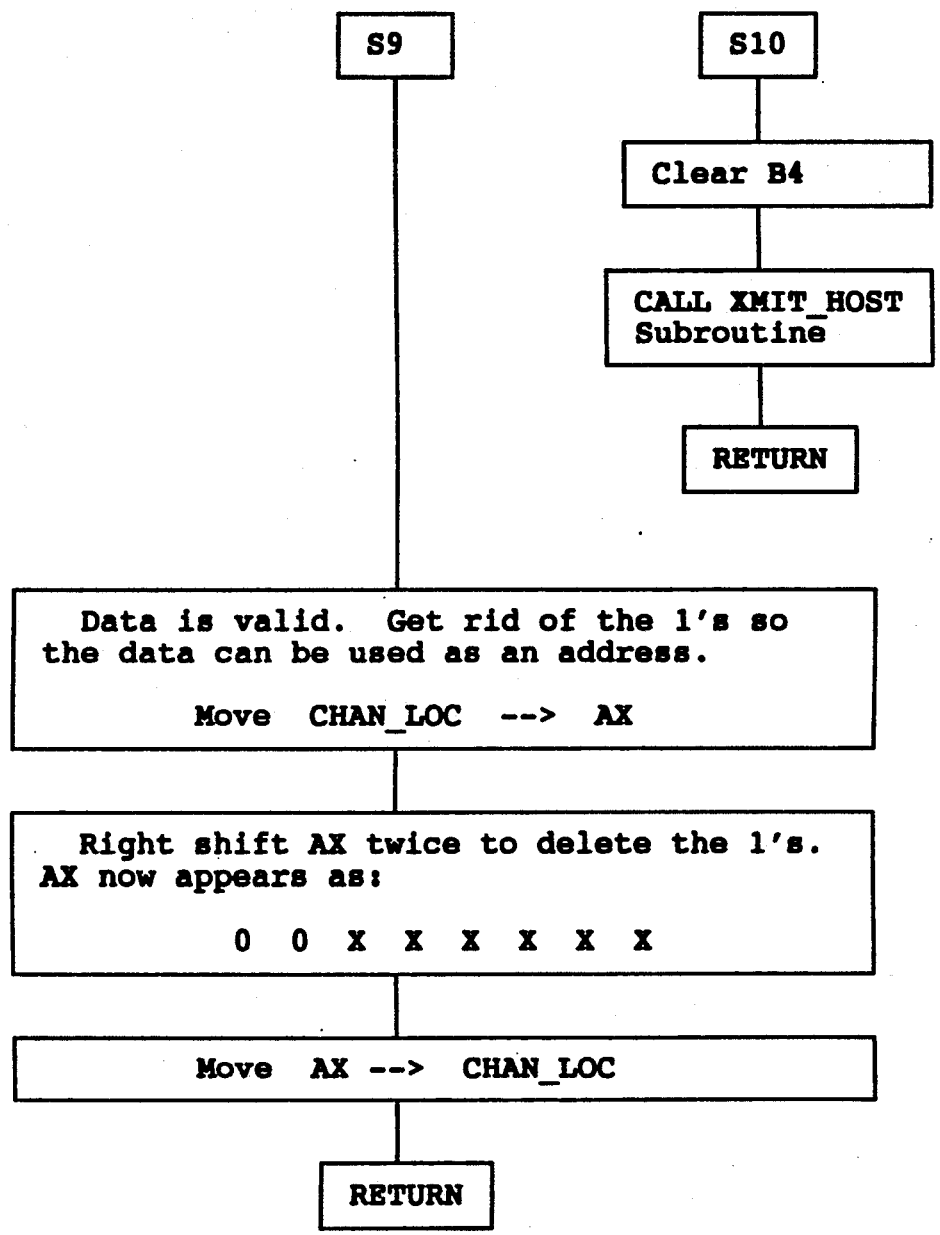
Figure 7G:
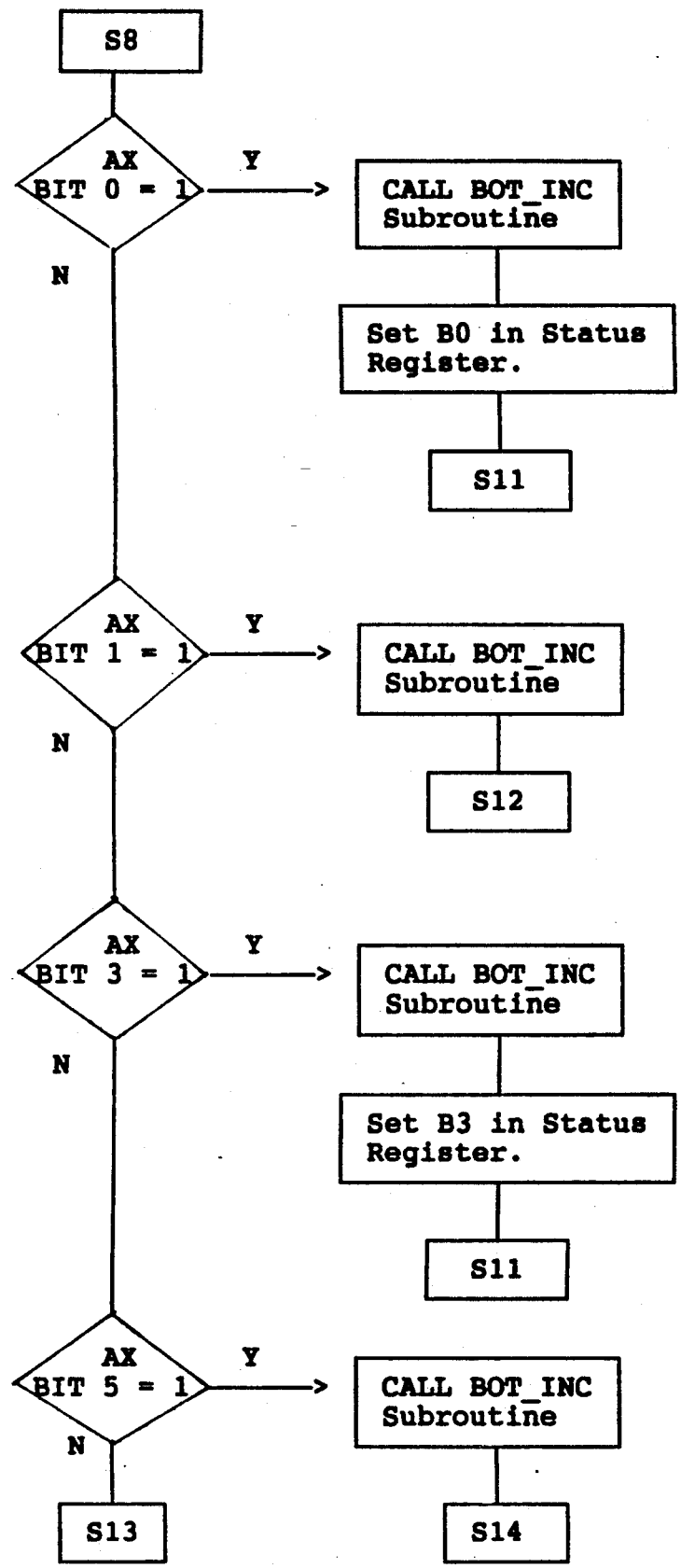
Figure 7H:
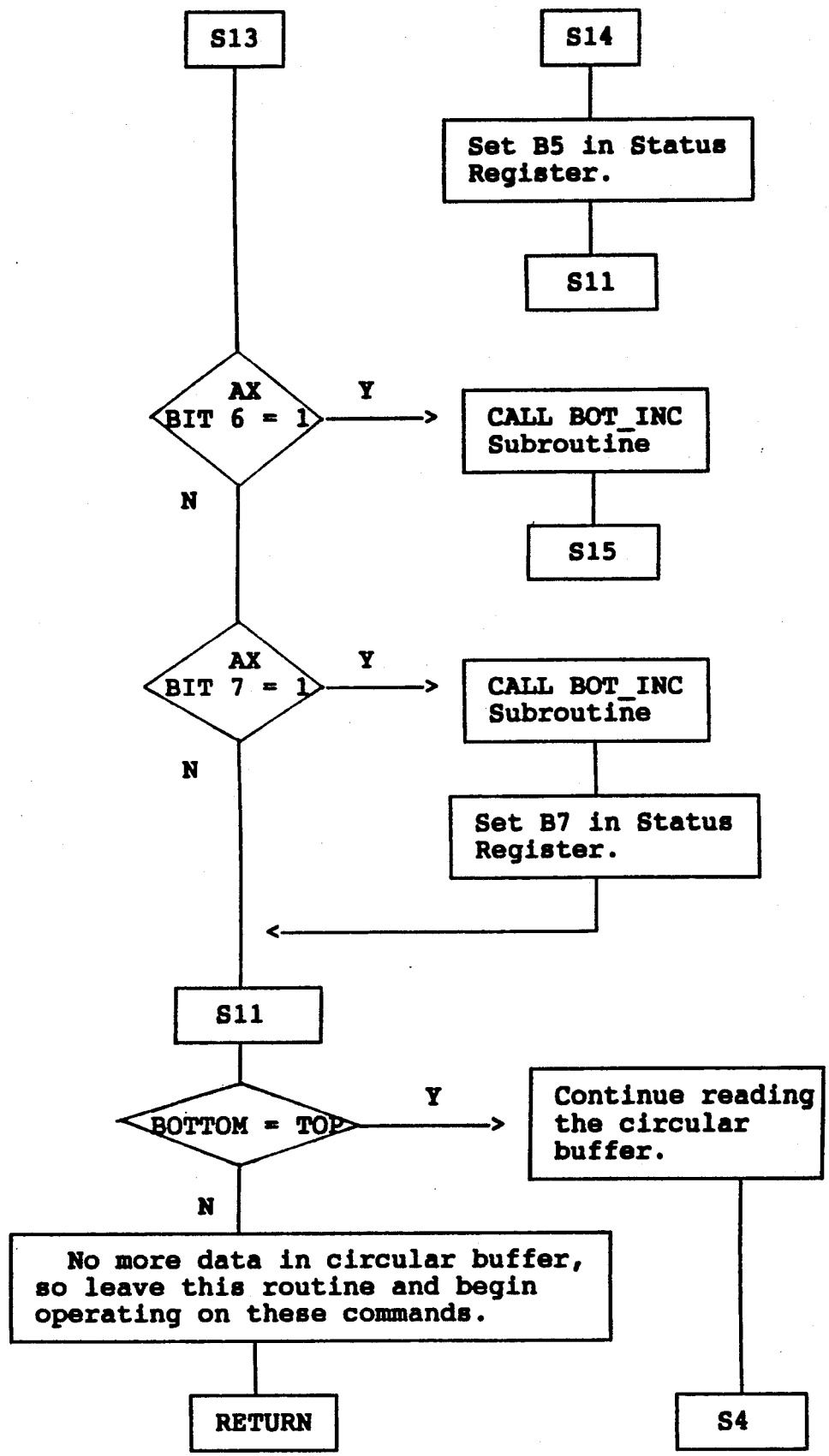
Figure 7I:
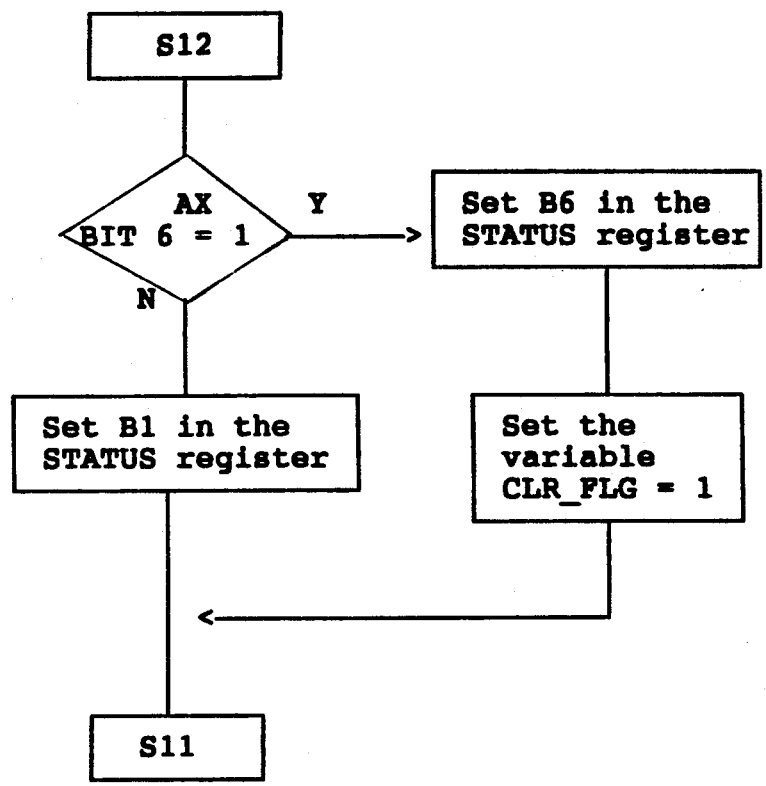
Figure 7J:
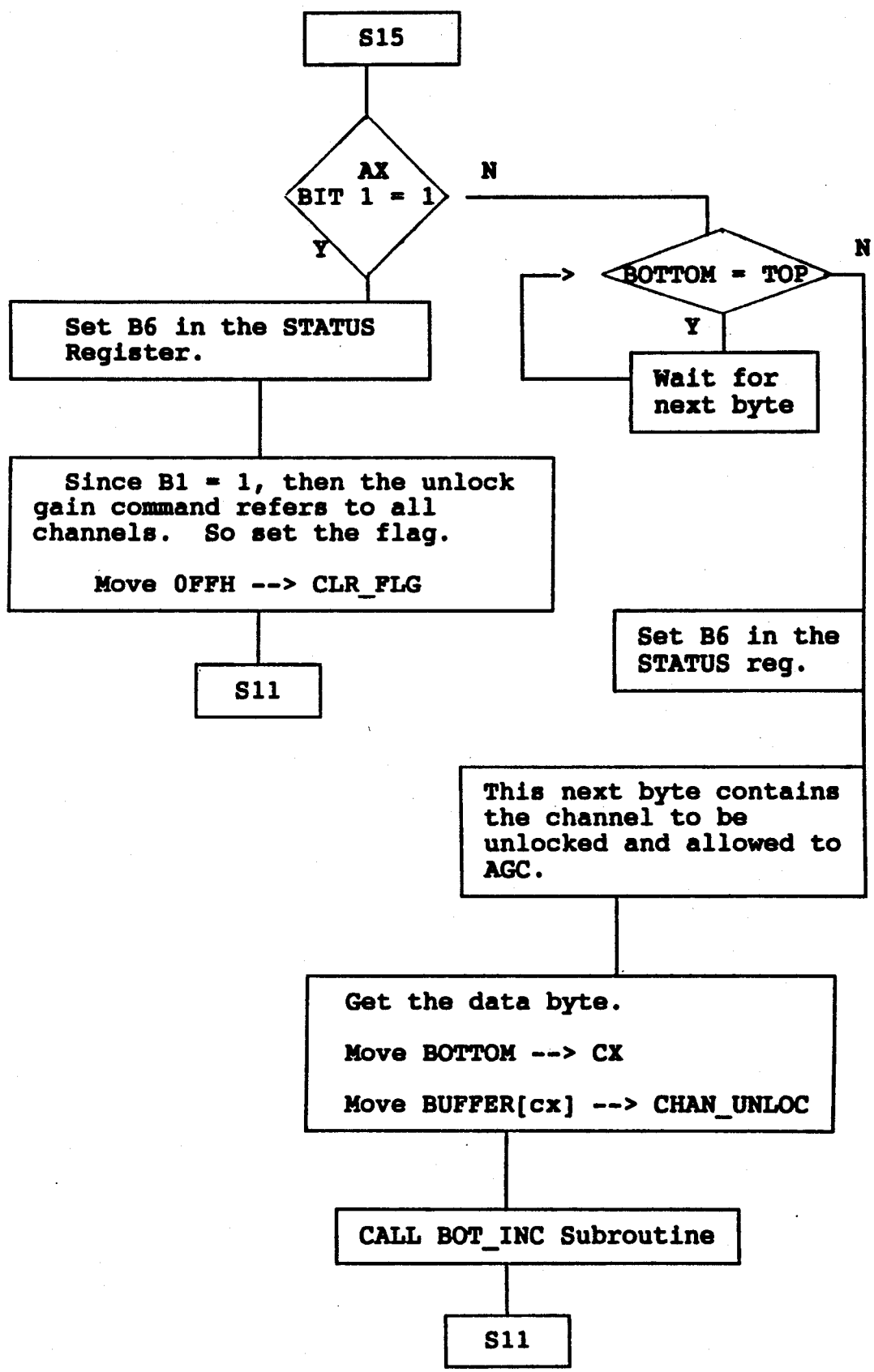
Figure 8:
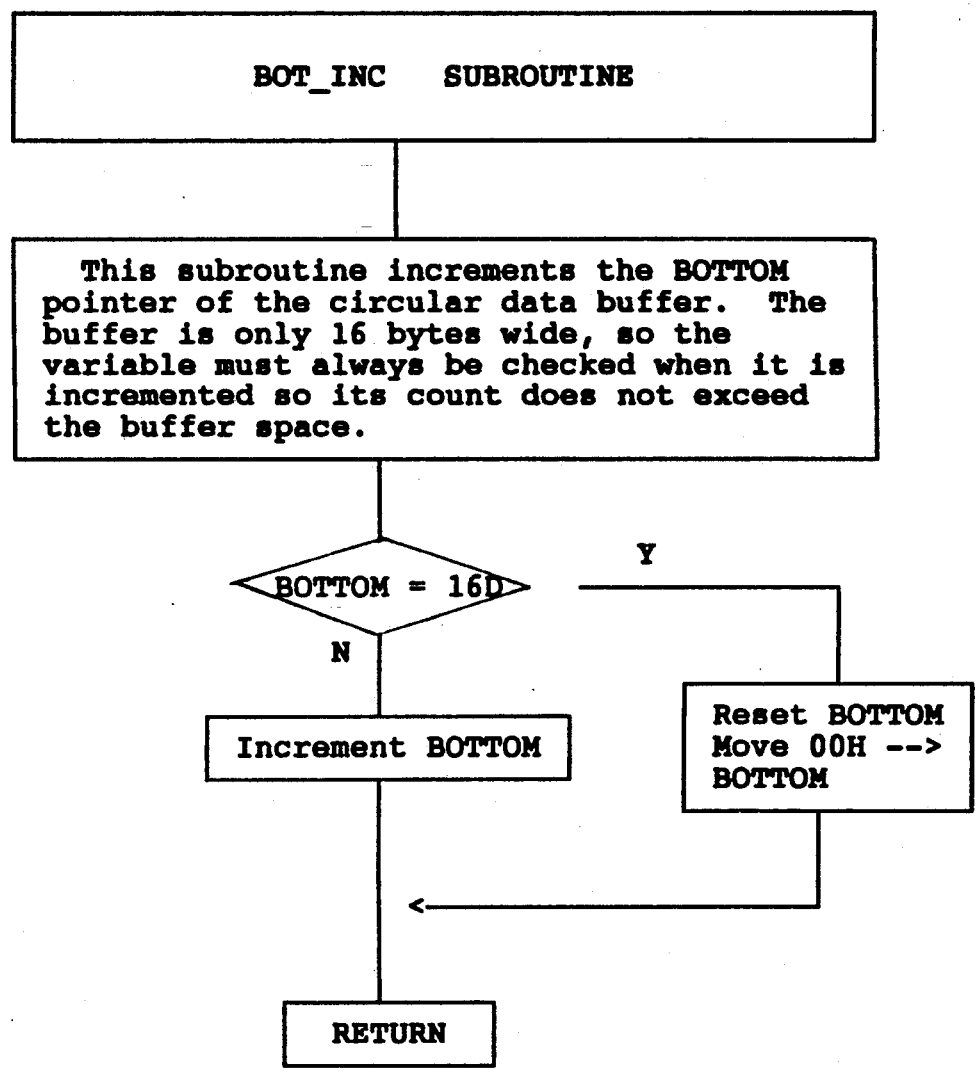
FIG. 8 is a Bottom Increment Subroutine Program flow chart of the operation of the Smart PGA System of FIGS. 1, 2 and 3.

Upon returning from the start-up routine, the Main Program initializes the serial I/O port for RS232 communications. It also sets up the Data Received (DATA REC) Subroutine of FIG. 6 which is called each time the μP's 25 serial port detects data. Received data is stored in a circular buffer and accessed by the μP 25 at its first convenience. The μP 25 accesses the received data through the Read (READ) Subroutine, FIG. 7a-j. As indicated in operation step boxes 42 and 44, FIG. 7b, and in programmer's notation box 46, FIG. 7c, this includes μP 25 providing the latch 22 of a given channel access to the applicable gain settings over gain bus 30, FIG. 2, by sending the given channel's CHANNEL address and master multiplexer (MUX_MST) address signals over lines 32 and 34 (FIGS. 2 and 3), respectively. This subroutine decodes each byte of data and sets the appropriate flags in the STATUS variable. Other decoded information relates to the gain setting of each PGA 20a-bl. This information is stored in the proper variables for later access by the Main Program. Each time the READ Subroutine decodes an entry in the data buffer, the Bottom Increment (BOT_INC) Subroutine, FIG. 8, is called. BOT_INC increments the pointer used by the Read Subroutine to point to the next data byte to be read. The Main Program then begins a continuous loop which comprises a series of conditional statements based on the state of flags stored in the STATUS variable. The flow chart details the operation of each STATUS flag. A host computer (HOST) which is not shown in the drawings, is located at the control station for the Digital Data Acquisition System. It has the ability to perform the following operations: (a) interrogate the μP 25 to provide status information, (b) request the current gain setting from one or all of the amplifiers, (c) set a PGA's 20a-bl gain to a particular level, and (d) set all the PGAs 20a-bl into an automatic gain control (AGC) mode or alternatively set individual PGAs 20a-bl to AGC.

All data words are transmitted from the HOST to the μP 25 in 8-bit format. The μP 25 is programmed to recognize that some commands consist of multiple bytes. When a command is received that signifies that additional information will follow, the μP 25 enters a loop to wait for the data. All data transmitted from the HOST to the μP 25 follows a specified format. The two least significant bits (LSBs) are always set to ones; the μP 25 is designed to recognize this pattern. If the two bits are not set then the μP 25 generates an error message and transmits it to the HOST. The HOST would then retransmit its last command for execution.

Figure 9B:
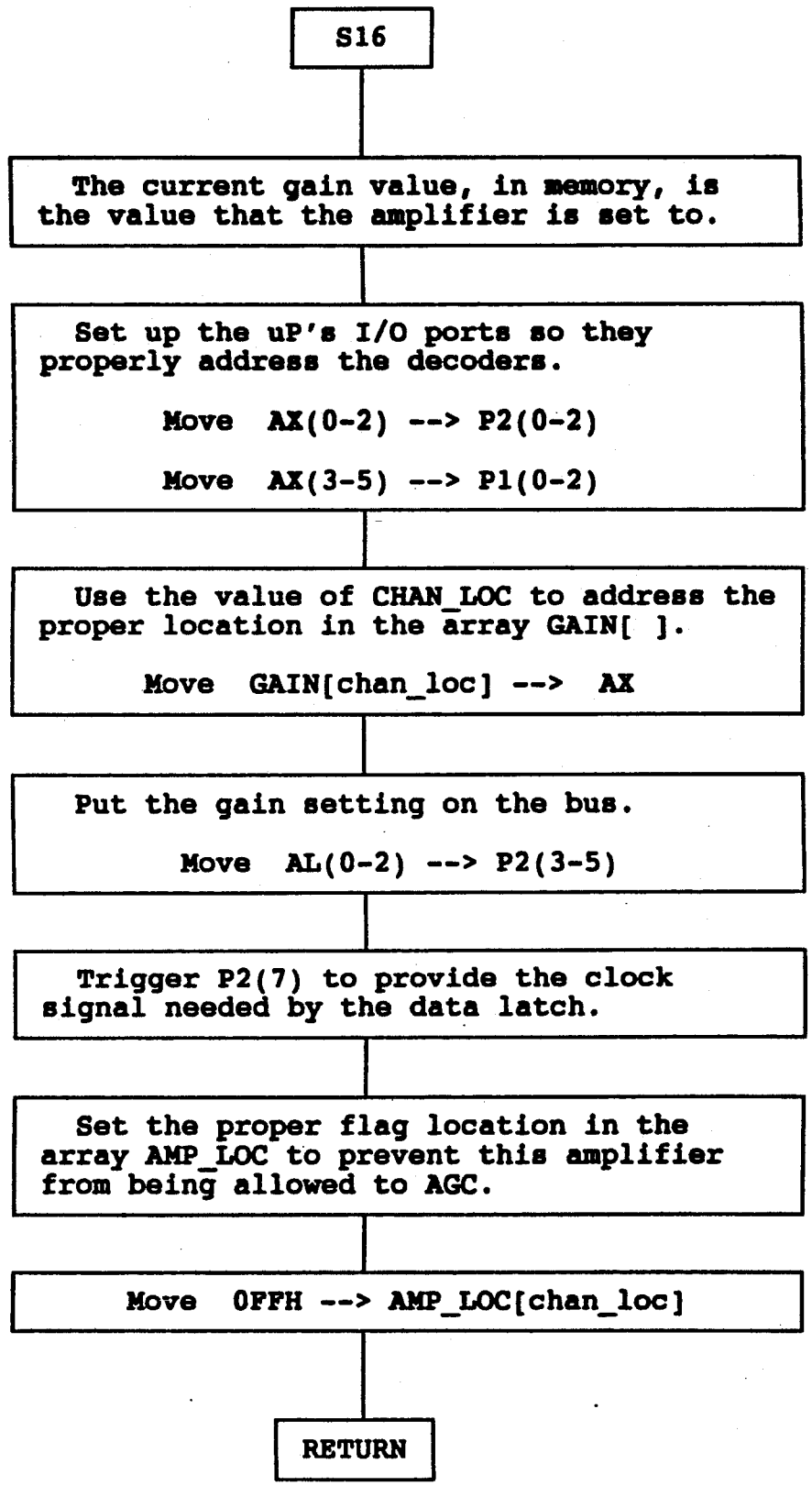
Figure 13A:
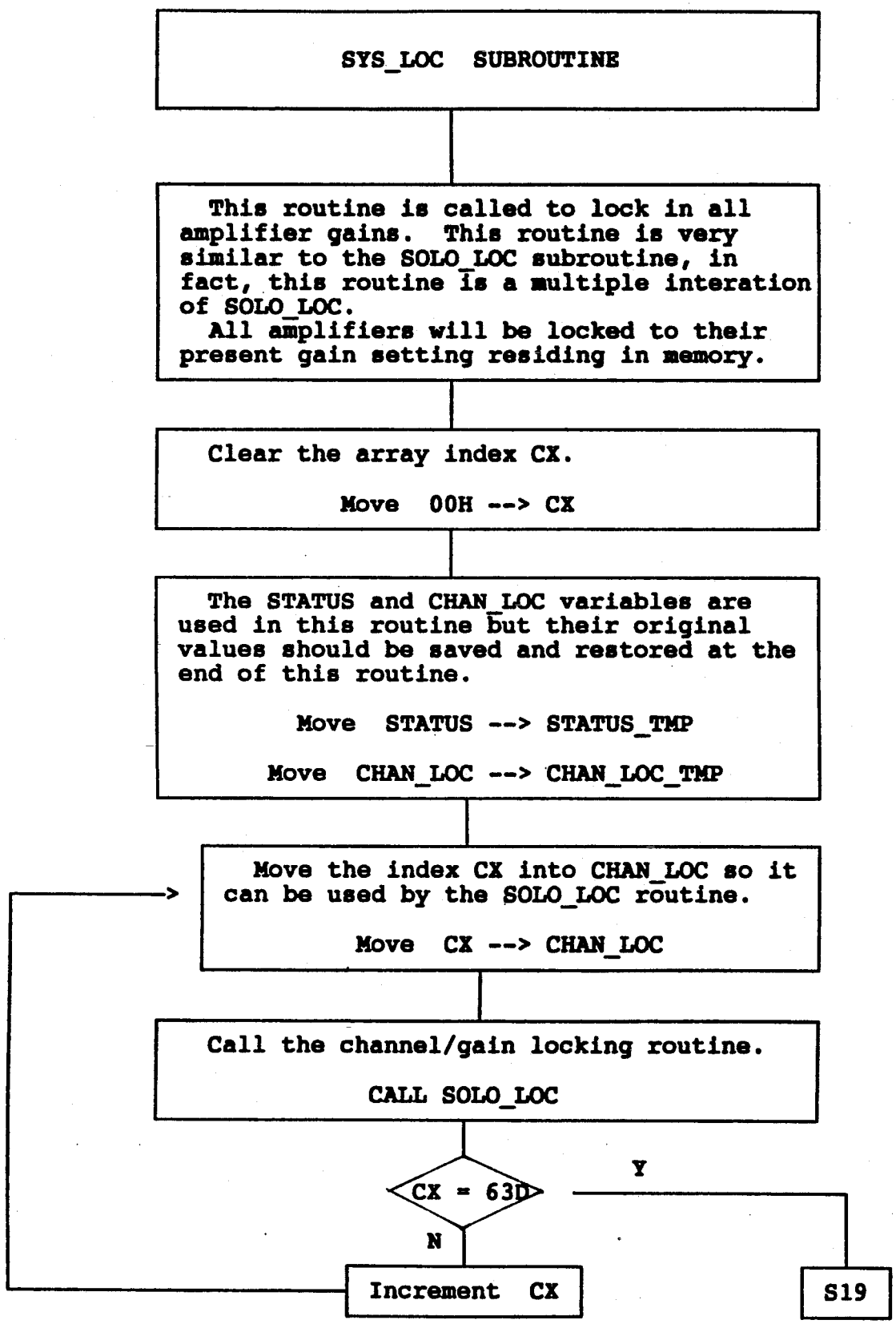
FIG. 13a-b is a SYS-LOC Subroutine Program flow chart of the operation of the Smart PGA System of FIGS. 1, 2 and 3.
Figure 13B:
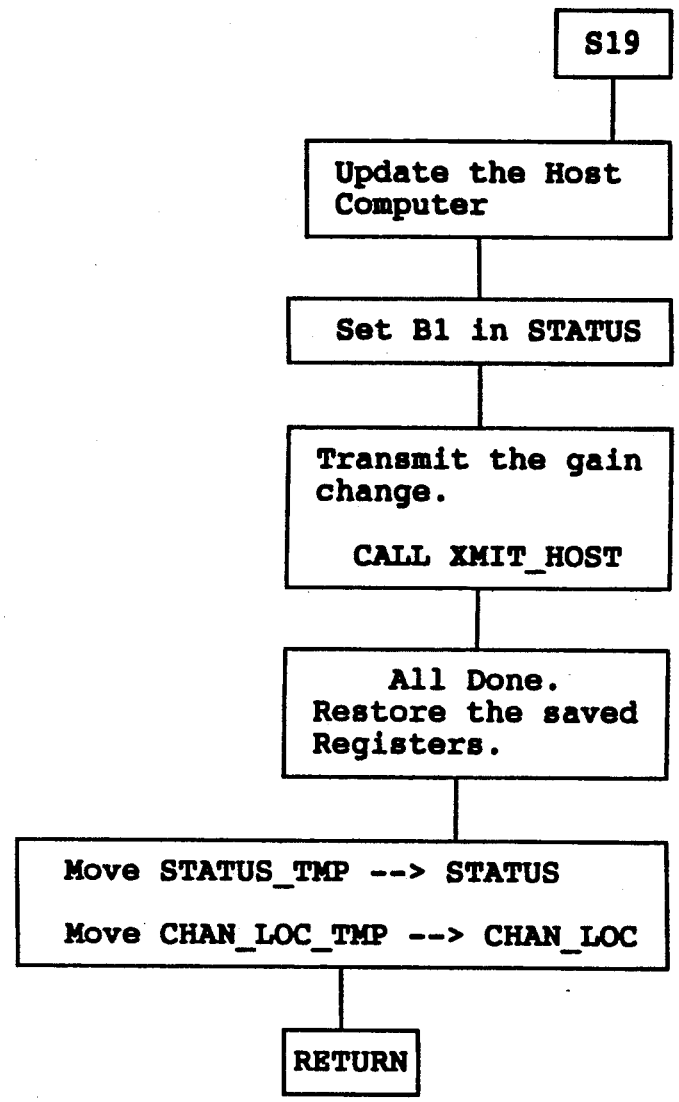
Figure 14C:
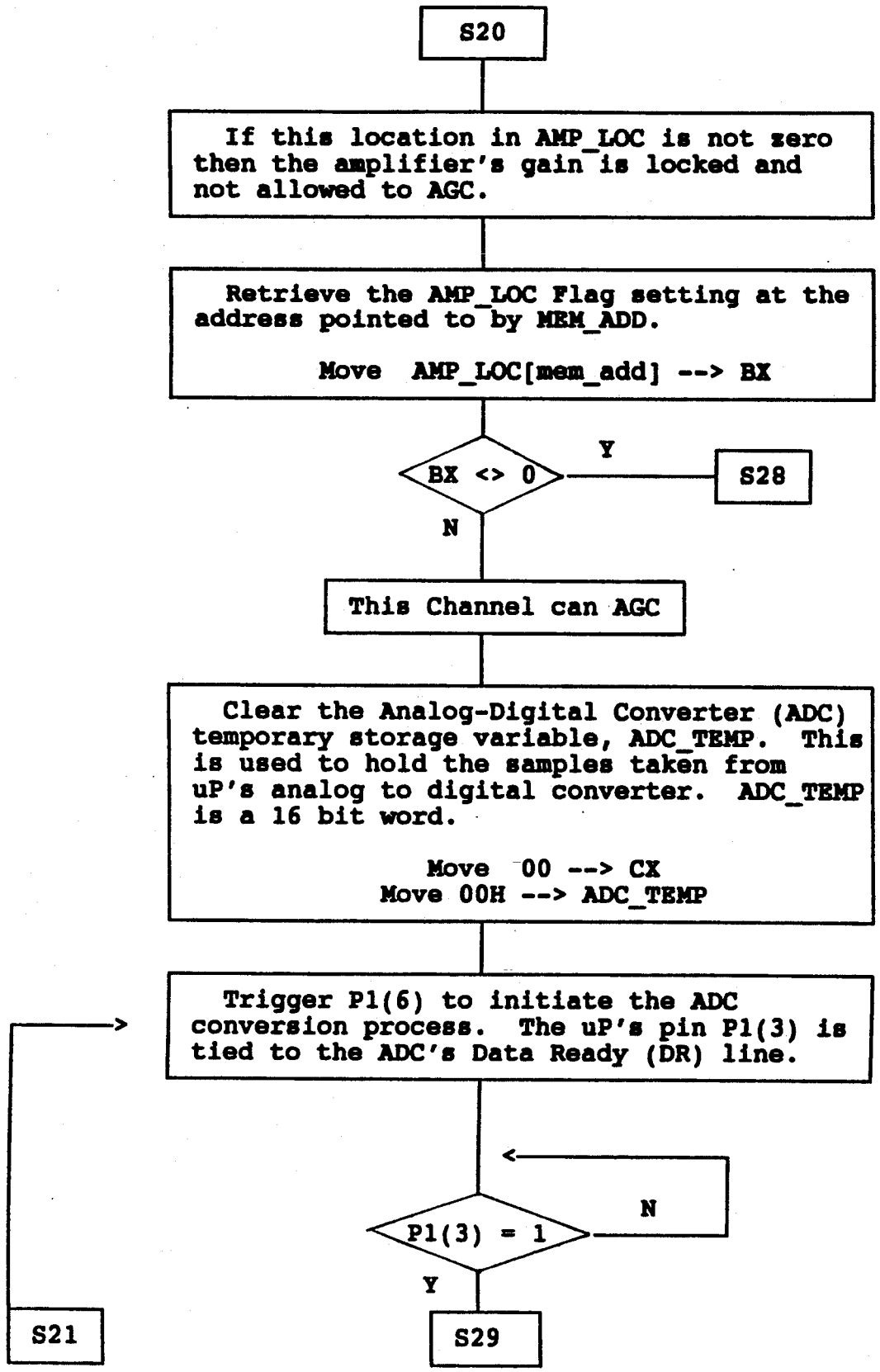
Figure 14D:
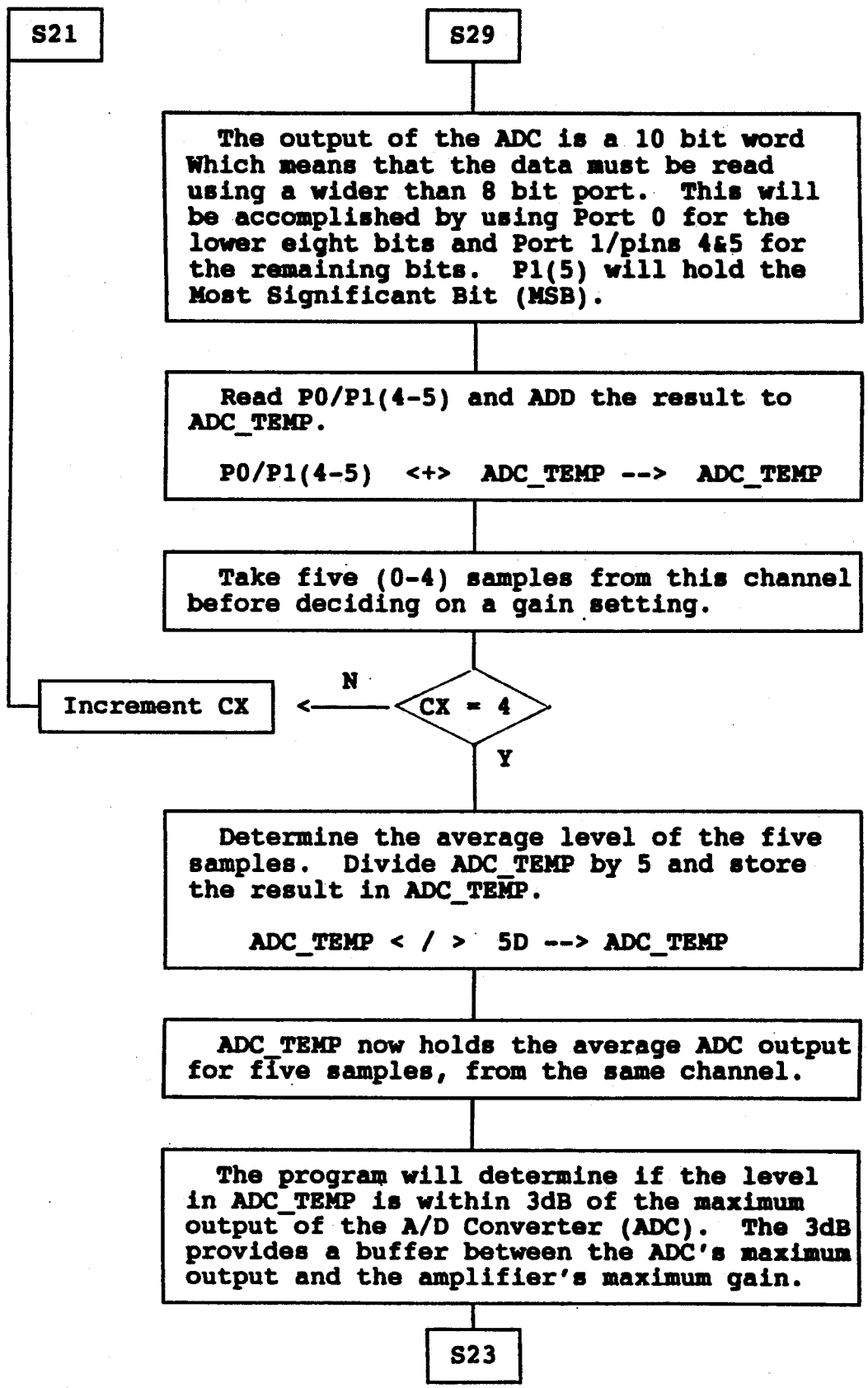
Figure 14E:
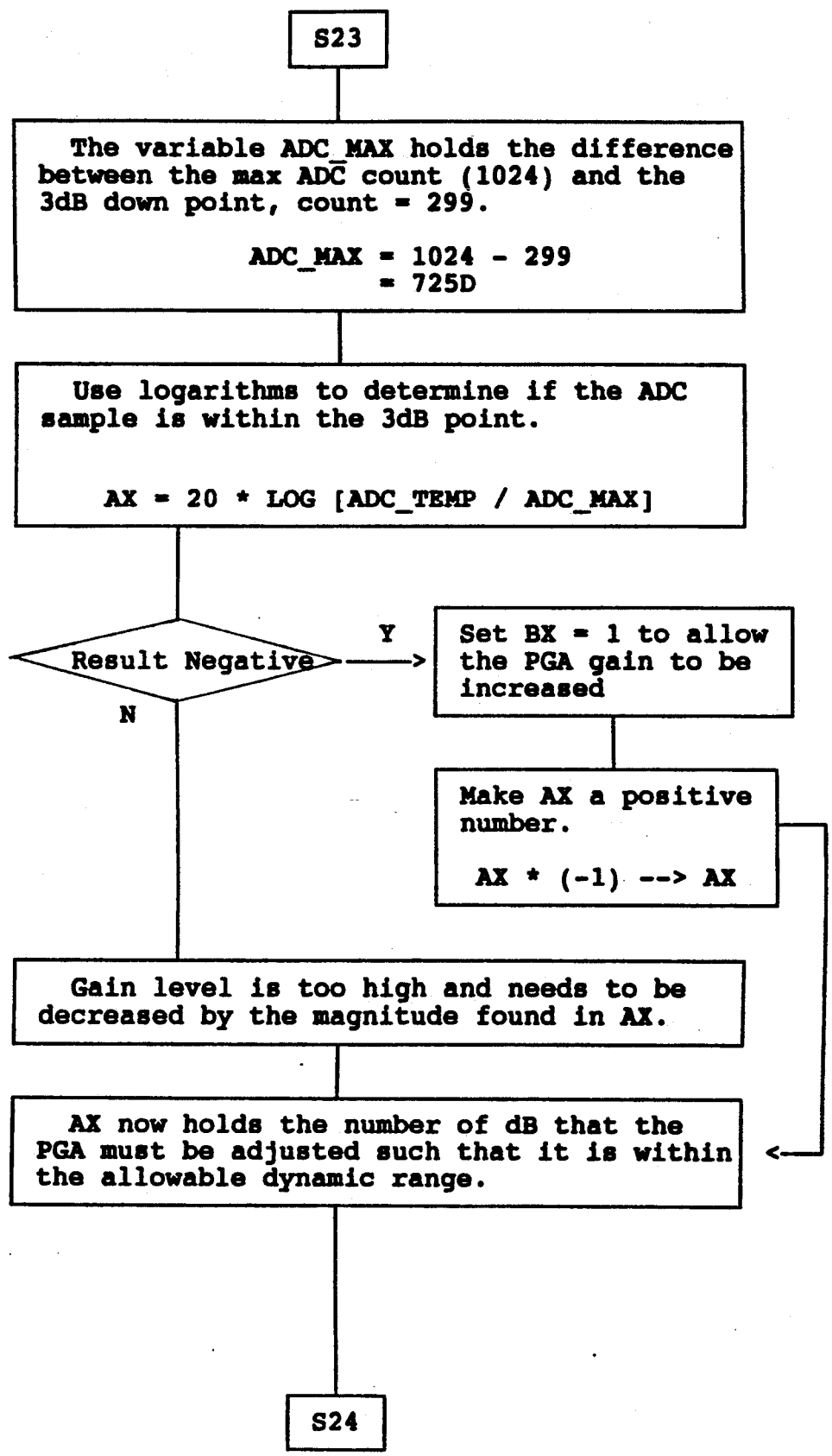
Figure 14F:
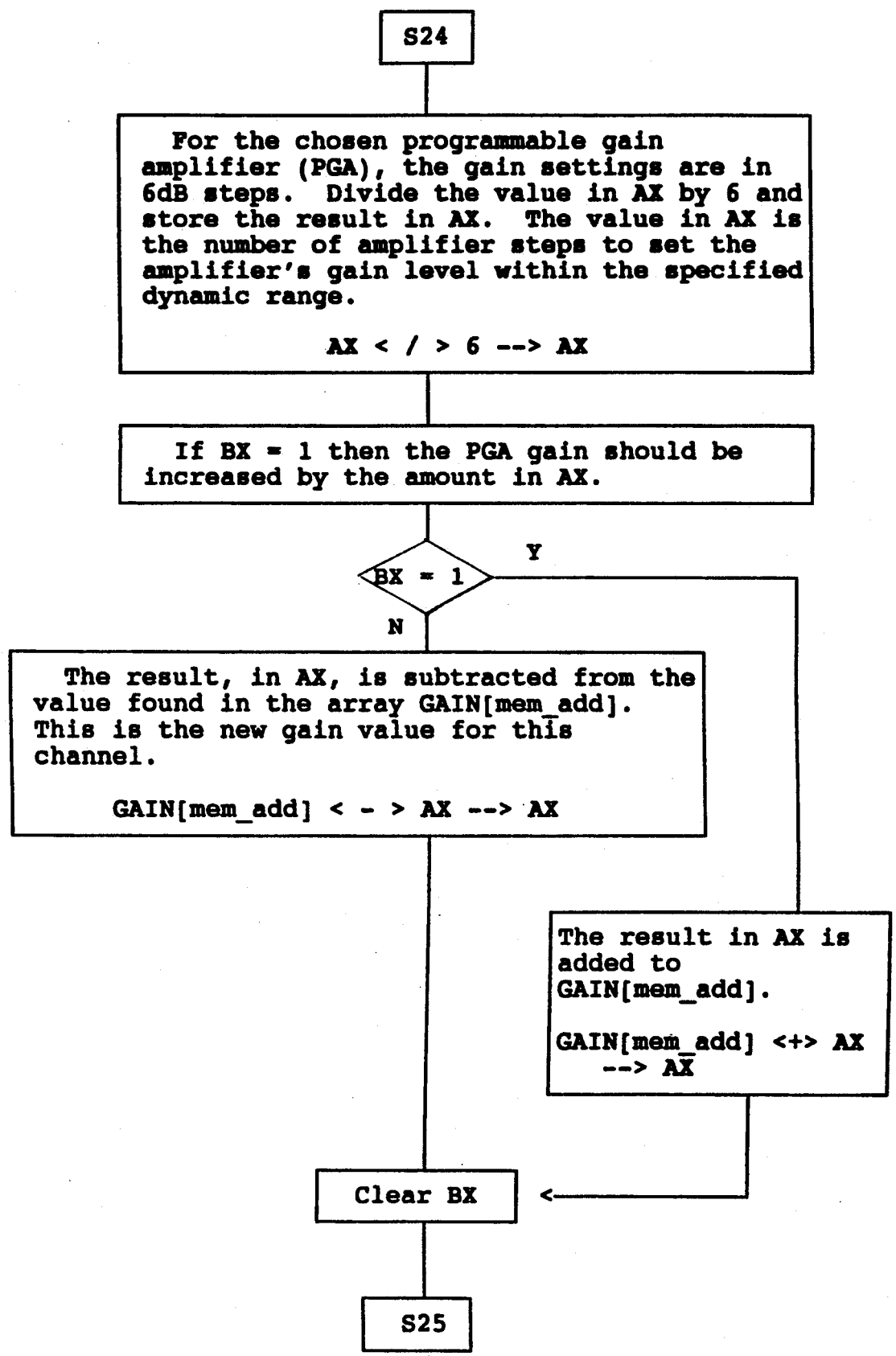
Figure 14G:
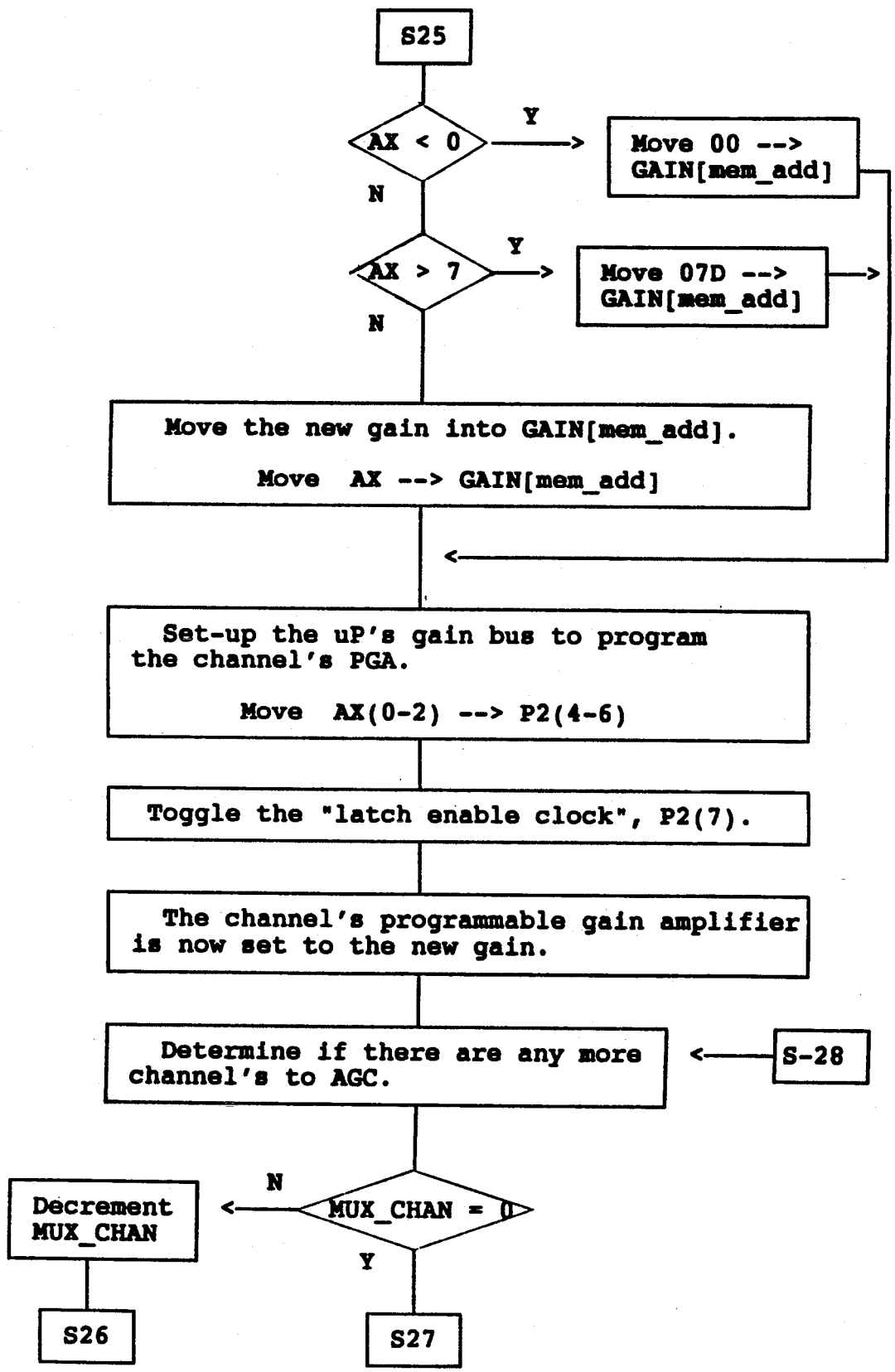
Figure 14H:
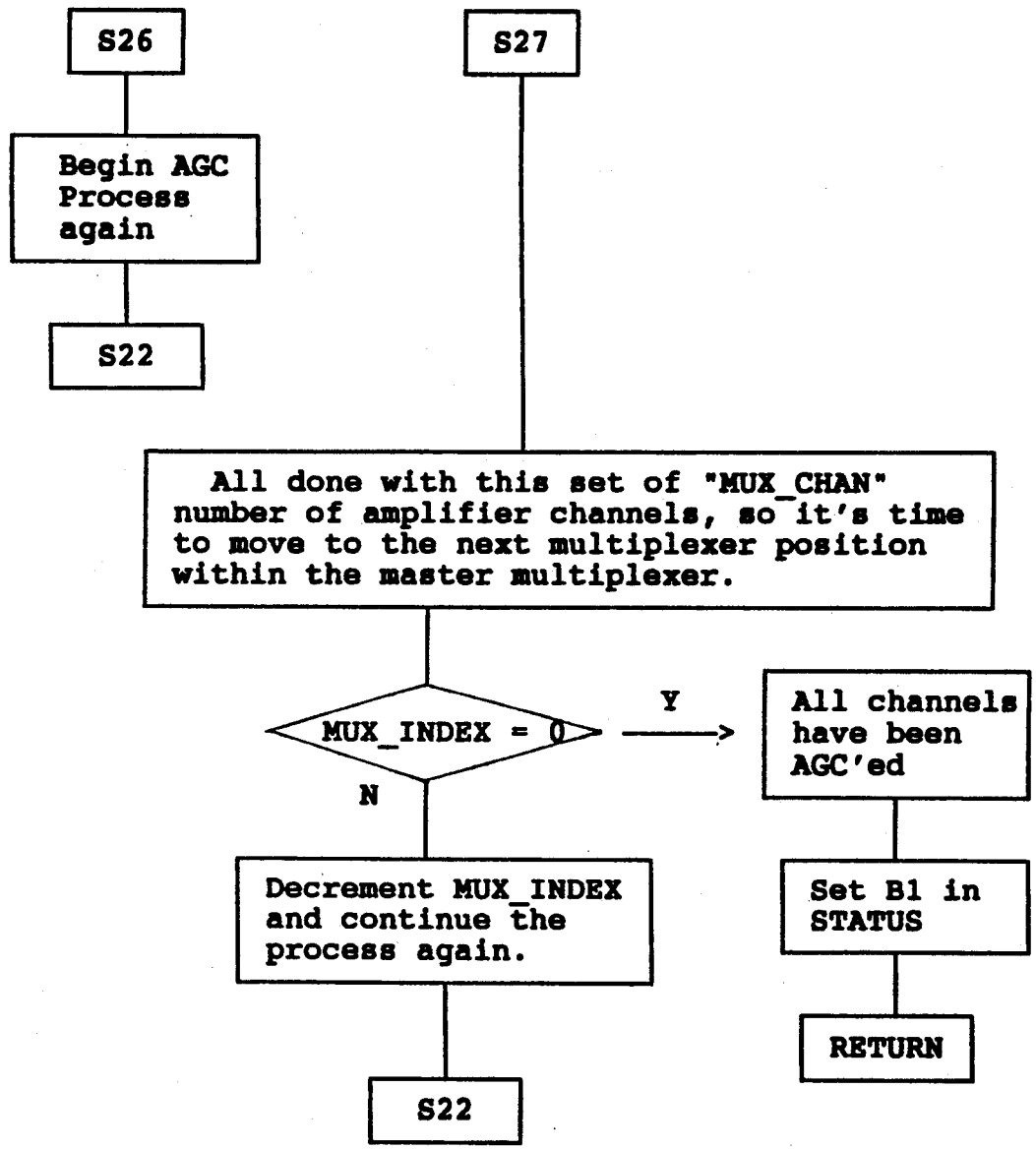

The main function of the μP 25 is its ability to automatically adjust the PGA's 20a-bl gain level such that maximum use is made of the data acquisition system's dynamic range. The System Automatic Gain Control (SYS_AGC) Subroutine FIG 14a-h is called to handle the mathematical calculations and hardware control necessary to adjust the gain of each PGA 20a-bl. This Subroutine is called by the Main Program when the STATUS flag for AGC mode is set. With this flag set, the μP 25 will poll each PGA 20a-bl and determine if a gain change is necessary. It takes five randomly spaced samples from each channel to determine a signal level average. By taking random samples the risk in always sampling a signal at its lowest point is reduced. The signal level in ADC count (the number of bits generated by the ADC for a given analog input), is compared with the maximum ADC count ($2^{10}=1024$, $10=$number of bits used in ADC#1 16) minus a ceiling of 3dB. The difference between the count value and the average signal count correspond to the number of dB that the PGA 20a-bl can be increased or decreased to maintain the proper signal level. The μP 25 compares the dB value with the amplification steps possible. It is not likely that the required gain adjustment will be exactly equal to the PGA's 20a-bl gain steps, so the μP 25 will have to determine the best possible selection. The μP 25 will adjust the PGA 20a-bl gain to the closest setting that is below the calculated gain. Doing this prevents an increase in the gain level that may saturate the PGA 20a-bl. The selected channel's 10a-bl address is placed on the μP's 25 output pins and in turn enables the channel's data latch 22a-bl. The PGA's 20a-bl new gain is placed on the gain bus 30 and the latch 22a-bl trigger is generated by the μP 25. The i trigger's rising edge causes the respective data latch 22a-bl to retain the gain setting and the respective PGA 20a-bl adjusts to the new amplification setting. The selected channel's 10a-bl gain is now corrected for the optimum setting given the current signal conditions. For a further summarization of this automatic adjustment, programmer's notation box 48, FIG. 14a, and particularly the last paragraph thereof. The next channel 10a-bl is selected and the AGC process is repeated. As will be apparent from operation step box 50, FIG. 14b, the channel address and the master multiplexer (MUX_MST) address signals at μP 25's output pins P2(0-2) and P1(0-2) are generated therefrom (i.e., from operation step 50. Two subroutines can be called by the user to either lock an individual channel (SOLO_LOC, FIG. 9a-b) or lock the entire system (SYS_LOC, FIG. 13a-b). The operator calls the SOLO_LOC Subroutine by entering the proper command and the channel number that is to be locked. The SYS_LOC Subroutine is similar to the SOLO_LOC Subroutine except that when the command is issued the μP 25 locks all the channels 10a-bl within the system and not just a specific one. A locking procedure can be instituted to prevent the μP 25 from changing a PGA's 20a-bl gain setting. If a channel 10a-bl is encountered that has been locked, the AGC routine skips this channel 10a-bl and proceeds with the next one.

Figure 11A:
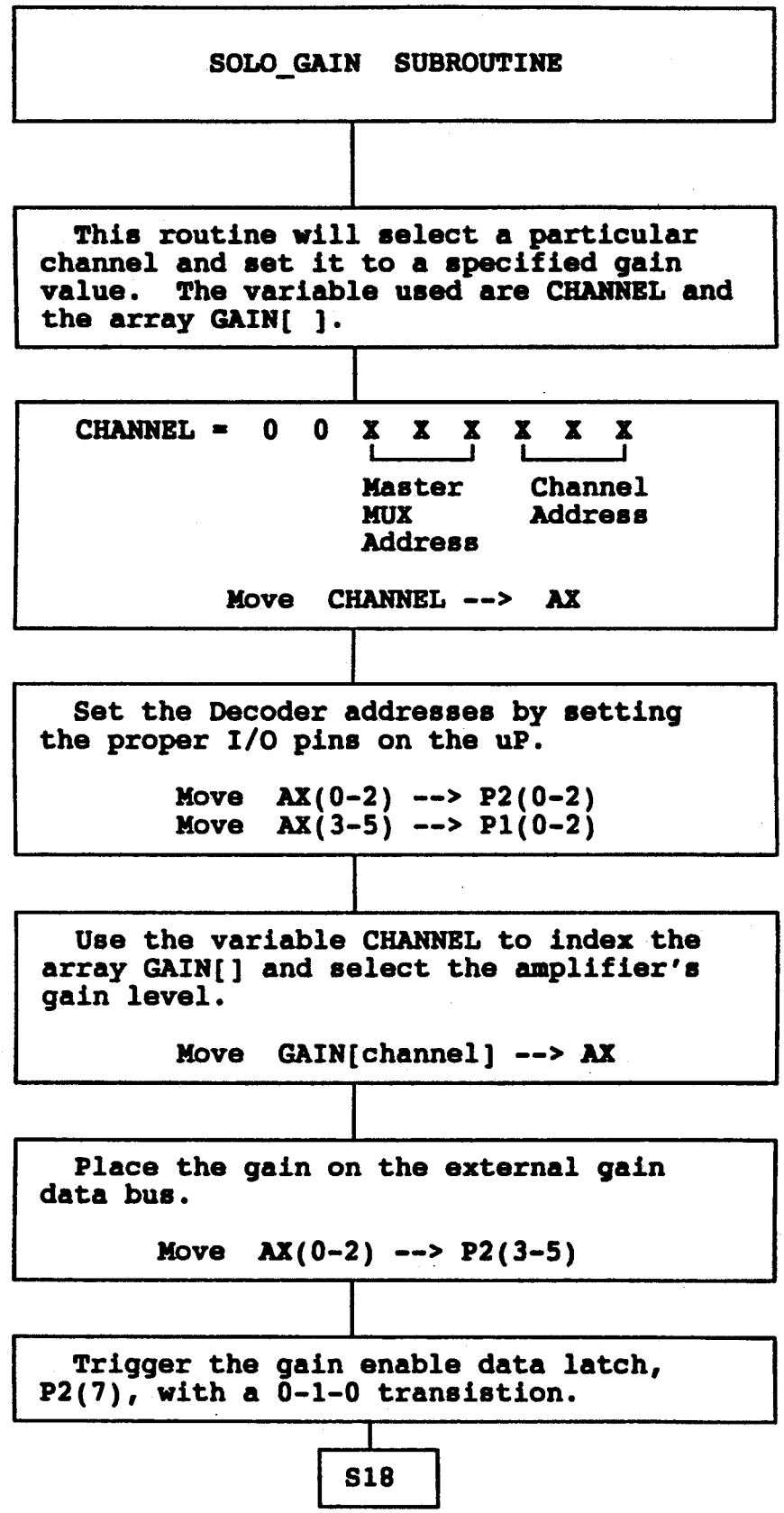
FIG. 11a-b is a Solo Gain Subroutine Program flow chart of the operation of the Smart PGA System of FIGS. 1, 2 and 3.
Figure 11B:
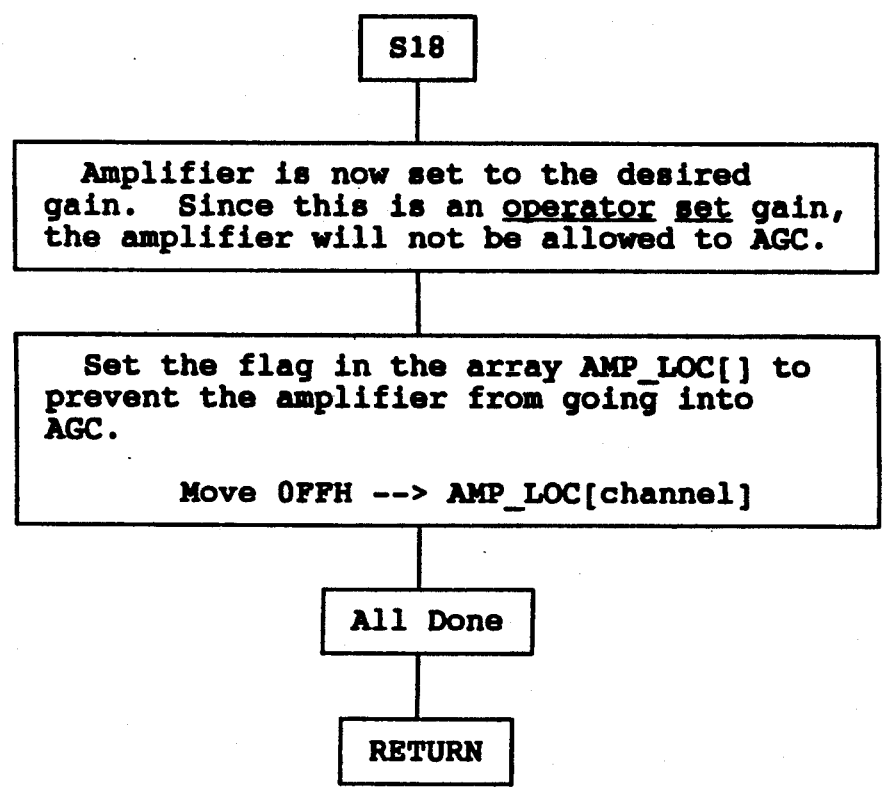
Figure 12:
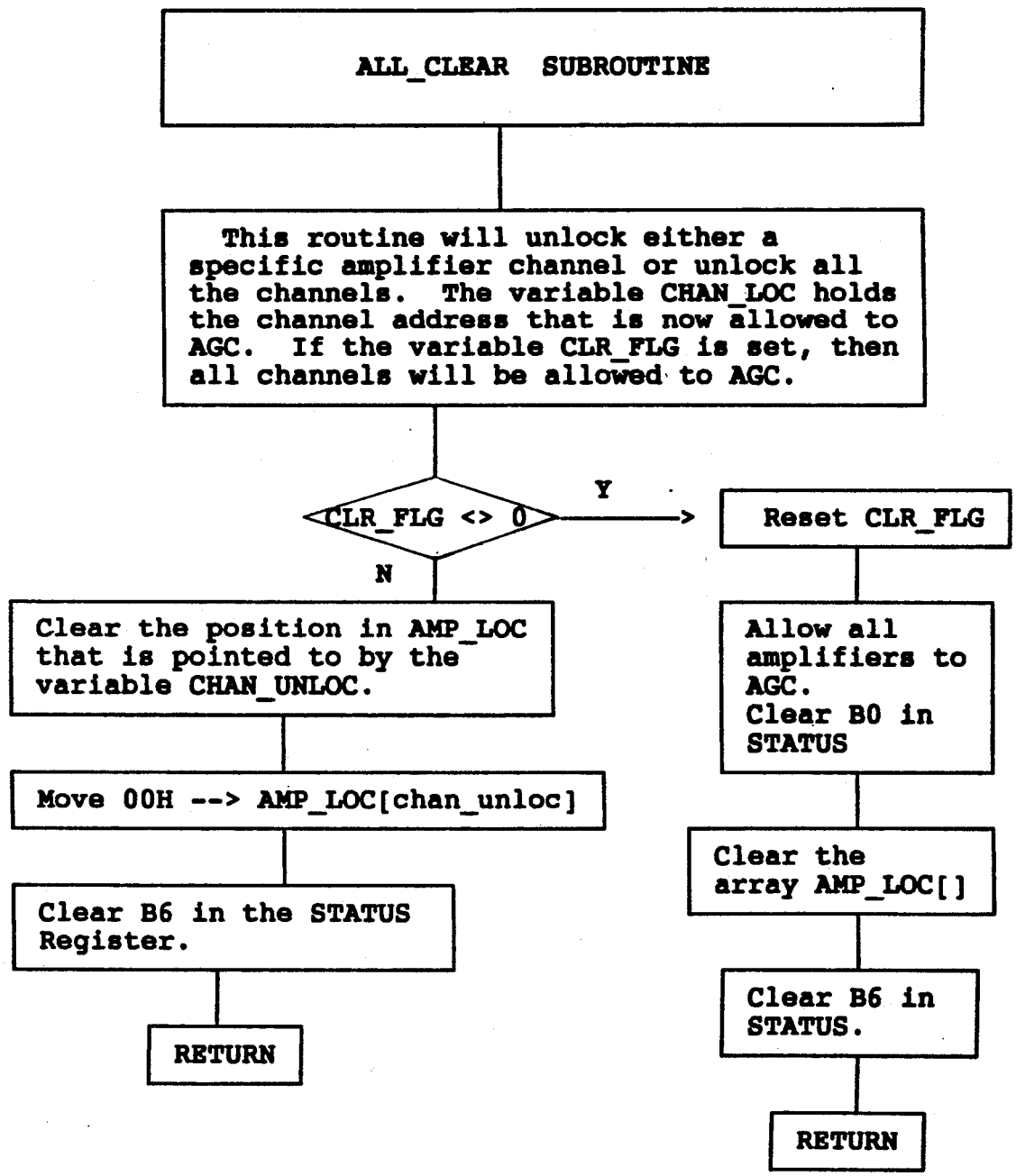
FIG. 12 is an All Clear Subroutine Program flow chart of the operation of the Smart PGA System of FIGS. 1, 2 and 3.

The operator can override any amplifier 20a-bl gain setting by entering the desired channel 10a-bl and the new gain setting. This action within the host computer activates the μP's 25 SOLO_GAIN Subroutine FIG. 11a-b. The amplifier's gain setting is altered to the new operator entered value and its gain is locked to prevent the system from altering the new gain with System Automatic Gain Control (SYS_AGC) Subroutine FIG. 14a-h. The All Clear (ALL_CLEAR) Subroutine, FIG 12, is initiated by the operator when it is desired to unlock a specific channel or all of the amplifier channels 10a-bl.

Reference is now made to programmers notation 52 (in part on FIG. 14a and in part on FIG. 14b). It will be appreciated that SYS_AGC SUBROUTINE's inclusion of a counting operation, which sequences through channel addresses and multiplexer addresses, sequences the latches 22 of all channels 10a-bl into access with μP 25's memory via gain bus 30.

Figure 10A:
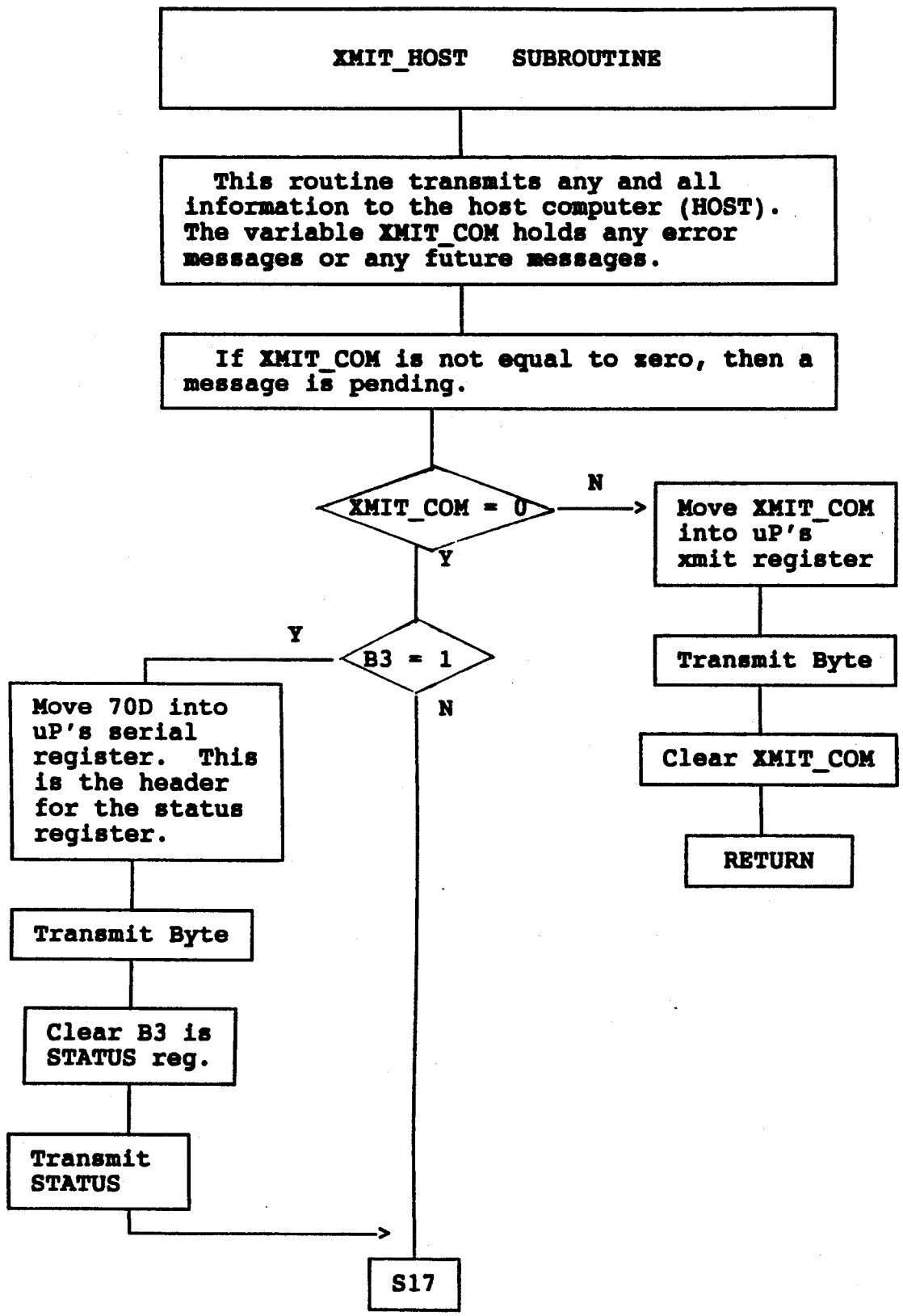
FIG. 10a-b is a Xmit Host Computer Subroutine Program flow chart of the operation of the Smart PGA System of FIGS. 1, 2
Figure 10B:
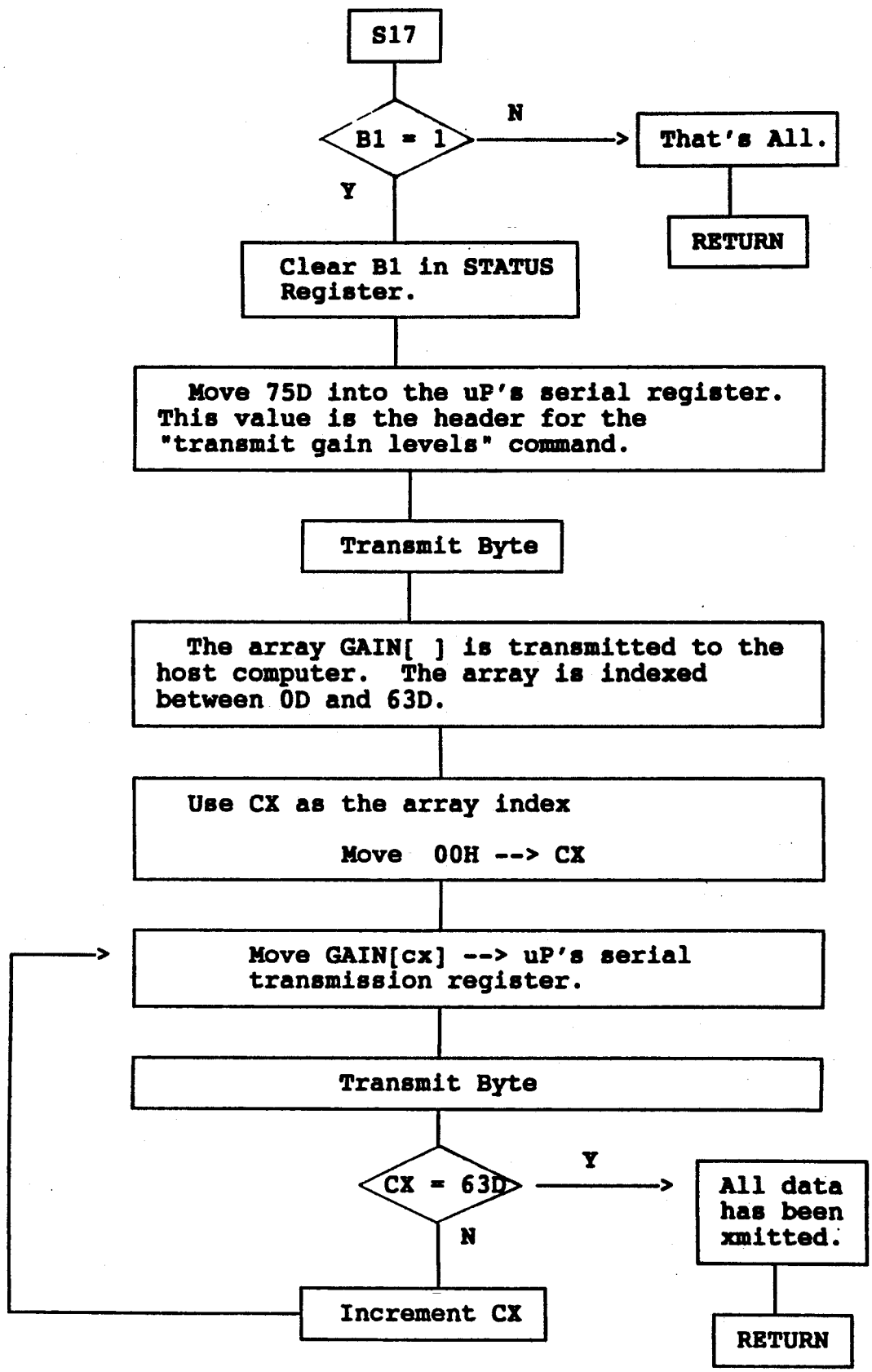

Once all channels 10a-bl have been completed, the AGC subroutine transmits all the new gain settings to the HOST and then returns control to the Main Program and polling of the STATUS flags begins again. The μP 25 transmission to the host computer is handled through the Transmit to Host (XMIT_HOST) Subroutine FIG. 10a-b. The routine transmits the current gain settings for each channel and the flag settings in the STATUS variable. Data is transmitted through the μP's 25 serial data port which was configured as part of the RESET Subroutine.

There has therefore been described a processing system that is small enough to be placed in the same electronics package as the receiving electronics. By doing this all post PGA electronics need only support a portion of the overall dynamic range. This enables less costly, readily available components to be utilized.

Also the present processing system supports wide bandwidth analog signals. The importance of this will be readily appreciated from the following. Given the set of conditions prior to the present invention; to achieve a 96 dB dynamic range ADC#2 would have to be at least 16 bits wide in order to use the minimum and maximum signal ranges. A 16-bit (analog to digital) A/D converter is an expensive unit and not fast enough to support wide bandwidth analog signals.

As stated above and in the flow diagrams, the AGC process is based on the average of five samples from each channel to eliminate gain changes based on spurious signals. This AGC process could also be accomplished by using a circuit which
measures RMS signal levels. The signal integration time could be increased to eliminate the effects due to vehicle tracking pings or ship motion.

The programmable gain amplifiers 20a-bl could be either off-the-shelf devices or a standard amplifiers which have their feedback resistor selected through an addressable analog switch to create the desired gain. The latter allows the designer to develop a system with as wide or as tight gain conditions as desired.

It will be understood that various changes in the details, materials, steps and arrangement of parts, which have been herein described and illustrated in order to explain the nature of the invention, may be made by those skilled in the art within the principle and scope of the invention as expressed in the appended claims.

What is claimed is:

1. In a gain amplifier system for processing a plurality of analog signals the combination comprising:
   a plurality of channel input means comprising automatic gain control amplifiers connected to receive and process respective ones of said analog signals, and to provide respective output analog signals, said automatic gain amplifiers further adapted to have their gain ranges adjusted.
   enabling means connected to said plurality of channel input means for selectively providing signals determining which of said automatic gain control amplifiers should have their ranges adjusted;
   multiplexer means connected to said automatic gain amplifiers for receiving said respective output analog signals and for selectively transmitting said respective output analog signals;
   an analog to digital converter connected to said multiplexer means, said analog to digital converter receiving and converting to binary form said transmitted analog signals;
   a microprocessor connected to said analog to digital converter for receiving in binary form said selectively transmitted analog signals, said microprocessor further being operative to provide control signals to said enabling means and to said multiplexer means, said microprocessor further being connected to the respective channel input means to adjust its gain ranges in response to the binary form of the selectively transmitted analog signal being processed by the respective channel input means;
   a gain range bus;
   said microprocessor being operatively connected to make gain range adjustments based upon periodic samples of the level of signals processed by the respective channel input means and to apply a signal representing a predetermined desired range to the gain range bus;
   each channel input means further comprising an AND gate having a first and second input connected to receive the control signals provided by the microprocessor to the enabling means, and AND gate providing an enabling output signal upon receipt of enabling signals on both inputs; and
   each channel input means still further comprising a data latch connected to receive and AND gate enabling output signal and to receive signals from said gain range bus, said data latch transmitting to the automatic gain amplifier the signal representing the predetermined desired gain range signal which it receives from the gain range bus upon receipt of an enabling output signal from the AND gate.

2. A system according to claim 1 wherein said enabling means further comprises:
   a first enable connected to receive the control signals provided by the microprocessor to the enabling means, said first enable having a plurality of output terminals with each output terminal connected to a plurality of first inputs of said AND gates, said first enable providing an enabling signal on only one output terminal at a given time; and a second enable connected to the control signals provided by the microprocessor to the enabling means, said second enable having a plurality of output terminals with each output terminal connected to a plurality of second inputs of said AND gates in a distribution so that no two AND gates are connected to the same first and second enable output terminals, said second enable providing an enabling signal on only one output terminal at a given time.

3. A system according to claim 2 further comprising:
the control signals which the microprocessor provides to said enabling means and to said multiplexer means comprising a channel address signal and a master multiplexer address signal, respectively;
a plurality of channel multiplexers with each of said channel multiplexers having a plurality of input terminals respectively connected to receive said automatic gain control amplifiers analog output signals, each of said channel multiplexers connected to said microprocessor for receiving the same channel address signals from said microprocessor, each of said channel multiplexers further having an output terminal for transmitting only one of said received amplifiers analog output signals at a time as determined by said microprocessor's channel address signals; and a master multiplexer having a plurality of input terminals respectively connected to receive said channel multiplexers analog output signals, said master multiplexer connected to said microprocessor for receiving master multiplexer address signals, said master multiplexer having an output terminal for transmitting only one of said received channel multiplexer analog output signals at a time as determined by said microprocessor's master multiplexer control signals.

4. A system according to claim 3 further comprising said first enable and said plurality of channel multiplexers connected to the same terminals of said microprocessor for receiving the same channel address signals.

5. A system according to claim 4 further comprising said second enable and said master multiplexer connected to the same terminals of said microprocessor for receiving the same multiplexer address signals.

6. A system in accordance with claim 3 wherein said microprocessor further comprises:
program means for sequentially counting through all channel addresses and through all master multiplexer addresses and providing these count values as the channel address and master multiplexer address signals, respectively.

* * * * *